US010742168B2

(12) United States Patent
Kozaki

(10) Patent No.: US 10,742,168 B2
(45) Date of Patent: Aug. 11, 2020

(54) OUTPUT CIRCUIT HAVING A VOLTAGE REGULATED PRE-DRIVER

(71) Applicant: Seiko Epson Corporation, Tokyo (JP)

(72) Inventor: Minoru Kozaki, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/286,796

(22) Filed: Feb. 27, 2019

(65) Prior Publication Data

US 2019/0267942 A1 Aug. 29, 2019

(30) Foreign Application Priority Data

Feb. 28, 2018 (JP) ................................ 2018-034969

(51) Int. Cl.

| | |
|---|---|
| ***H03B 5/04*** | (2006.01) |
| ***H03K 3/356*** | (2006.01) |
| ***G05F 1/575*** | (2006.01) |
| ***H03B 5/36*** | (2006.01) |
| ***H03L 7/099*** | (2006.01) |

(52) U.S. Cl.

CPC ............... *H03B 5/04* (2013.01); *G05F 1/575* (2013.01); *H03B 5/36* (2013.01); *H03K 3/356104* (2013.01); *H03L 7/099* (2013.01)

(58) Field of Classification Search

CPC .... H03K 3/356104; G05F 1/575; H03B 5/36; H03B 5/04; H03L 7/099

USPC ...................... 323/283; 331/74, 186; 347/13

See application file for complete search history.

(56) References Cited

U.S. PATENT DOCUMENTS 5,633,611 A 5/1997 Kohno et al.
2011/0133789 A1* 6/2011 Nagumo .......... H03K 17/08108 327/108

FOREIGN PATENT DOCUMENTS

JP H08-335881 A 12/1996

* cited by examiner

*Primary Examiner* — Arnold M Kinkead

(74) *Attorney, Agent, or Firm* — Harness, Dickey & Pierce, P.L.C.

(57) ABSTRACT

An output circuit includes first and second nodes, a regulator, a pre-driver, and an output driver. The regulator outputs a second voltage to the second node based on a first voltage applied to the first node. The output driver receives a signal from the pre-driver and outputs a second signal. The regulator short-circuits the first and second nodes while the pre-driver is in a standby state, and controls the second voltage to be different from the first voltage after the pre-driver transitions from the standby state to a normal operation state.

15 Claims, 11 Drawing Sheets

OUTPUT CIRCUIT HAVING A VOLTAGE REGULATED PRE-DRIVER

BACKGROUND

1. Technical Field

The present invention relates to an output circuit, an oscillator, and an electronic apparatus.

2. Related Art

FIG. 10 in JP-A-8-335881 illustrates a complementary current source circuit including a main current source, a driving circuit which supplies a driving signal to the main current source, and a power supply circuit which supplies a power supply voltage to the driving circuit. In the complementary current source circuit, the driving circuit outputs the driving signal according to an input signal by the power supply voltage being supplied from the power supply circuit separated from the main current source and the main current source outputs a differential current by turning on or off a switching transistor for differential according to the driving signal from the driving circuit. By converting the current output from the main current source into a voltage, as a logic level according to the input signal, a differential signal of which an amplitude or a slope is adjusted is obtained, so that it is possible to use the differential signal as an output circuit. According to the output circuit having this configuration, even if the power supply voltage of the main current source increases and decreases, since the power supply circuit which supplies the power supply voltage to the driving circuit maintains a constant voltage, it is possible to suppress a waveform of the differential signal generated from the main current source from being changed.

In the output circuit using the complementary current source circuit in JP-A-8-335881, when current consumption of the driving circuit changes, the power supply voltage supplied to the driving circuit is changed. Therefore, practically, it is difficult to keep the output differential signal at a desired waveform. In order to solve this problem, as described below, it is desirable to provide a voltage control mechanism which compares the power supply voltage with a reference voltage by using an operational amplifier and keeps the power supply voltage more constant. However, even in this case, specifically, when an input of a signal is started at the time of activating or the like, if the driving circuit starts to draw a high current from the power supply circuit, it takes time for the voltage control mechanism to appropriately operate, so that the voltage supplied from the power supply circuit instantaneously and largely decreases. For this reason, there is a problem that the waveform of the output signal is disturbed.

SUMMARY

An output circuit according to an aspect of the invention includes: a regulator which outputs a second voltage to a second node based on a first voltage applied to a first node; a pre-driver to which a first signal is input and which operates based on the second voltage; and an output driver to which a signal from the pre-driver is input and which outputs a second signal, in which the regulator short-circuits the first node and the second node while the pre-driver is in a standby state, and controls the second voltage to be a voltage different from the first voltage after the pre-driver transitions from the standby state to a normal operation state.

It is preferable that the output circuit according to the aspect of the invention further includes: a control circuit which supplies a control signal to the regulator, in which the regulator includes a first transistor which is connected between the first node and the second node and supplies a current to the second node based on a gate voltage, an amplifier which performs feedback control on the gate voltage of the first transistor based on the second voltage, and a second transistor which controls the gate voltage of the first transistor and short-circuits the first node and the second node based on the control signal.

In the output circuit according to the aspect of the invention, it is preferable that an operation of the amplifier is stopped while the first node and the second node are short-circuited.

In the output circuit according to the aspect of the invention, it is preferable that the first transistor is a depletion type NMOS transistor.

In the output circuit according to the aspect of the invention, it is preferable that the control circuit is a D-type flip-flop circuit in which a reset signal is input to a reset terminal and the first signal is input to a clock terminal.

An oscillator according to an aspect of the invention includes: the output circuit according to the aspect of the invention, and a clock signal generation circuit which generates the first signal.

An electronic apparatus according to still another aspect of the invention including: the output circuit according to the aspect of the invention, and a clock signal input circuit to which the second signal output from the output circuit is input.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, embodiments of the invention will be described in detail with reference to the accompanying drawings. The embodiments to be described below do not limit the scope of the invention described in the appended claims. In addition, all of configurations to be described below are not essential components of the invention.

1. Output Circuit

1-1. First Embodiment

Figure 1:
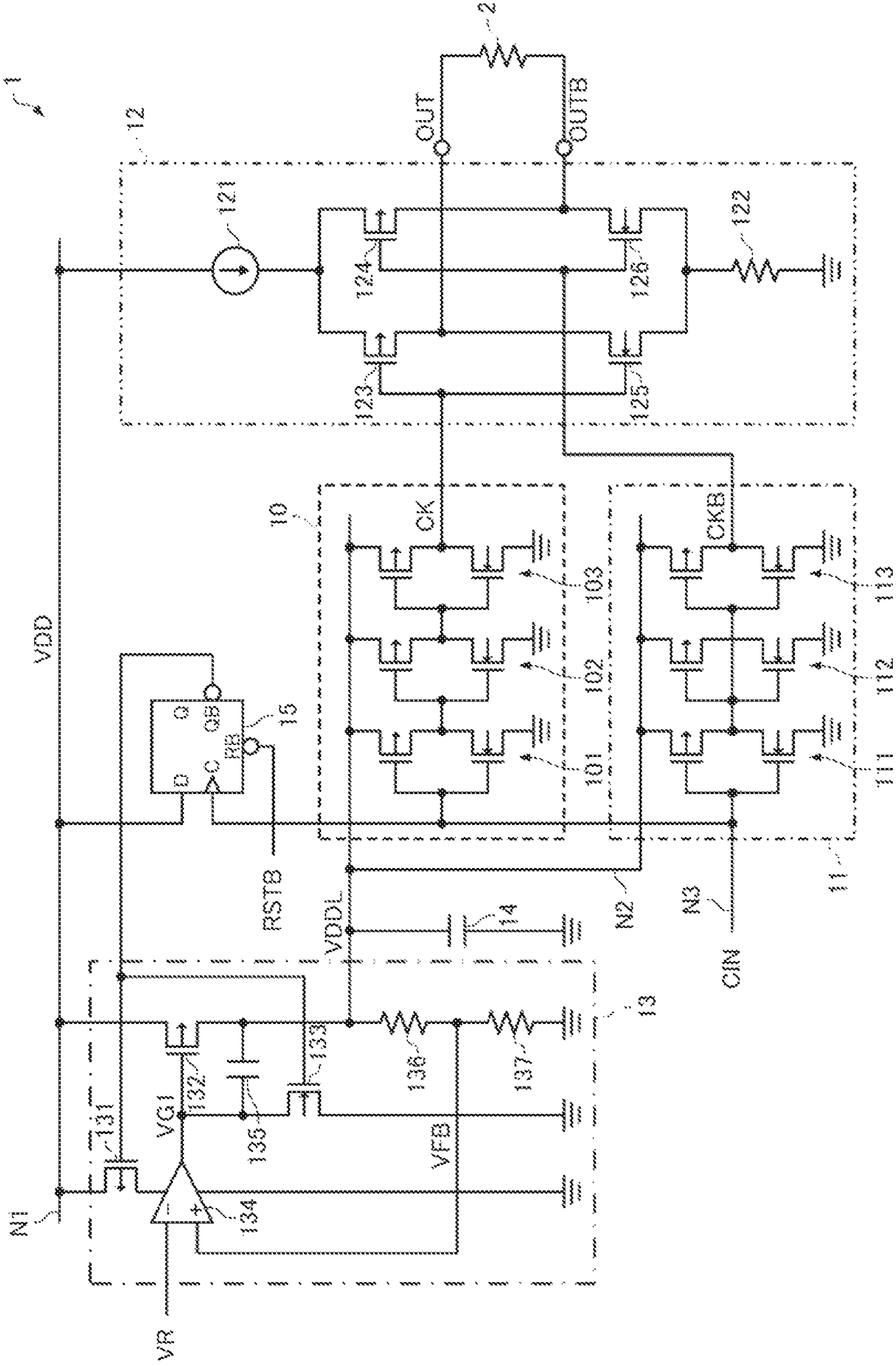
FIG. 1 is a diagram illustrating a configuration of an output circuit according to a first embodiment.

FIG. 1 is a diagram illustrating a configuration of an output circuit 1 according to a first embodiment. As illustrated in FIG. 1, the output circuit 1 according to the first embodiment includes a pre-driver 10, a pre-driver 11, an output driver 12, a regulator 13, a bypass capacitor 14, and a flip-flop circuit 15. A node N1 is a node electrically connected to a power supply terminal (not illustrated) of the output circuit 1, and a power supply voltage VDD is applied to the node N1.

Anode N3 is anode electrically connected to an input terminal of the pre-drivers 10 and 11, and an input signal CIN is applied to the node N3.

The input signal CIN is input to the pre-drivers 10 and 11 and the pre-drivers 10 and 11 operate based on a regulator voltage VDDL. The pre-driver 10 generates a driving signal CK and the pre-driver 11 generates a driving signal CKB. The pre-driver 10 includes three inverter circuits 101, 102, and 103 connected in series and the pre-driver 11 includes two inverter circuits 111 and 113, and a dummy inverter circuit 112 connected in series. The inverter circuit 112 has a function of matching a delay time of the pre-driver 11 with a delay time of the pre-driver 10. Since the pre-driver 10 is an inverting circuit and the pre-driver 11 is a non-inverting circuit, the driving signals CK and CKB are complementary signals of which phases are inverted from each other. The driving signals CK and CKB are input to the output driver 12.

Signals from the pre-drivers 10 and 11 are input to the output driver 12 and the output driver 12 outputs an output signal. The output driver 12 includes a constant current source 121 on a side of the node N1 and a resistor 122 on ground side and includes PMOS transistors 123 and 124 which are P-channel type Metal Oxide Semiconductor Field Effect Transistors (MOSFETs) and NMOS transistors 125 and 126 which are N-channel type MOSFETs between the constant current source 121 and the resistor 122. These four MOS transistors 123, 124, 125, and 126 constitute a bridge circuit as illustrated.

Gate terminals of the PMOS transistor 123 and the NMOS transistor 125 are connected to each other, and the driving signal CK is input to the gate terminals. In addition, drain terminals of the PMOS transistor 123 and the NMOS transistor 125 are connected to each other, and the drain terminals are electrically connected to an output terminal OUT of the output circuit 1. In the same manner, gate terminals of the PMOS transistor 124 and the NMOS transistor 126 are connected to each other, and the driving signal CKB is input to the gate terminals. In addition, drain terminals of the PMOS transistor 124 and the NMOS transistor 126 are connected to each other, and the drain terminals are electrically connected to an output terminal OUTB of the output circuit 1. A load resistor 2 is connected between the output terminals OUT and OUTB.

In a case where the driving signal CK is at a low level (a ground level) and the driving signal CKB is at a high level (for example, a regulator voltage VDDL level), the MOS transistors 123 and 126 are conducted and the MOS transistors 124 and 125 are not conducted, and a current output from the constant current source 121 flows to ground via the PMOS transistor 123, the load resistor 2, the NMOS transistor 126, and the resistor 122. That is, a potential of the output terminal OUT becomes higher than a potential of the output terminal OUTB. Logically, the output terminal OUT corresponds to a state of "high" and the output terminal OUTB corresponds to a state of "low".

On the other hand, in a case where the driving signal CK is at the high level and the driving signal CKB is at the low level, the MOS transistors 124 and 125 are conducted and the MOS transistors 123 and 126 are not conducted, and the current output from the constant current source 121 flows to ground via the PMOS transistor 124, the load resistor 2, the NMOS transistor 125, and the resistor 122. That is, a potential of the output terminal OUTB becomes higher than a potential of the output terminal OUT. Logically, the output terminal OUT corresponds to the state of "low" and the output terminal OUTB corresponds to the state of "high".

For example, in a case where the output circuit 1 outputs a signal of a standard low voltage differential signaling (LVDS) type, an output current of the constant current source 121 is 3.5 mA and the load resistor 2 is 100Ω. In this case, output signals appearing at both ends (the output terminals OUT and OUTB) of the load resistor 2 are respectively complementary signals with amplitudes of 350 mV. A central voltage (offset voltage) of the output signal is determined by a resistance value of the resistor 122, and in a case where the output signal is a standard LVDS type signal, the central voltage is adjusted so as to be 1.25 V. In order to automatically perform the adjustment, the resistor 122 may often be a voltage controlled variable resistor. Since a voltage controlled variable resistor is well-known, a description thereof will be not repeated here.

Since the four MOS transistors 123, 124, 125, and 126 have to instantaneously turn on or off the current of 3.5 mA, a MOS transistor with high driving capability is applied. Therefore, the pre-drivers 10 and 11 for driving each of the gate terminals of the MOS transistors 123, 124, 125, and 126 also require high driving capability.

The output circuit 1 according to the first embodiment includes the regulator 13. The regulator 13 includes PMOS transistors 131 and 132, an NMOS transistor 133, an operational amplifier 134, a capacitor 135, and resistors 136 and 137. The regulator 13 outputs the constant regulator voltage VDDL to a node N2 based on the power supply voltage VDD applied to the node N1. Specifically, the regulator 13 steps down the power supply voltage VDD so as to generate a constant regulator voltage VDDL and outputs the regulator voltage VDDL to the node N2.

The PMOS transistor 132 is electrically connected between the node N1 and the node N2 and supplies a current to the node N2 based on a gate voltage. That is, an output current from the regulator 13 to the node N2 is supplied via the PMOS transistor 132. A feedback voltage VFB obtained by dividing the regulator voltage VDDL by resistors 136 and 137 is input to a non-inverting input terminal (+) of the operational amplifier 134 and a stable reference voltage VR is input to the other inverting input terminal (−). An output voltage VG1 of the operational amplifier 134 increases or decreases depending on magnitude of the feedback voltage VFB. Accordingly, a gate voltage of the PMOS transistor 132 increases or decreases and current supply capability of the PMOS transistor 132 increases or decreases. If the feedback voltage VFB is higher than the reference voltage VR, the output voltage VG1 of the operational amplifier 134 increases and the current supply capability of the PMOS transistor 132 is decreased. If the feedback voltage VFB is lower than the reference voltage VR, the output voltage VG1 of the operational amplifier 134 decreases and the current supply capability of the PMOS transistor 132 is increased. In this way, the operational amplifier 134 functions as an amplifier for performing feedback control on the gate voltage of the PMOS transistor 132 based on the regulator voltage VDDL.

As a result, since the circuits are balanced in a state in which the feedback voltage VFB and the reference voltage VR are approximately equal to each other, the regulator voltage VDDL is given by the following equation (1) and becomes a stable voltage independent of the power supply voltage VDD. In the equation (1), R1 is a resistance value of the resistor 136 and R2 is a resistance value of the resistor 137.

$$VDDL = \left(1 + \frac{R1}{R2}\right) \times VR \quad (1)$$

The capacitor 135 connected between the gate terminal and the drain terminal of the PMOS transistor 132 is for stabilizing the voltage control mechanism described above. In many cases, a resistor is inserted in series with the capacitor 135, but in FIG. 1 the resistor is omitted.

The bypass capacitor 14 is connected between the node N2 which is an output node of the regulator 13 and ground. By the bypass capacitor 14, the regulator voltage VDDL is more stabilized for rapid fluctuation in the power supply voltage VDD and is more stabilized for a steep change in current consumption of the pre-drivers 10 and 11 operating based on the regulator voltage VDDL. The effect increases as a capacity of the bypass capacitor 14 increases.

Peak values of the driving signals CK and CKB, that is, the regulator voltage VDDL are desired to be values equal to or higher than voltages of source terminals of the PMOS transistors 123 and 124 so that the driving signals CK and CKB can block the PMOS transistors 123 and 124. In addition, for the input signal CIN as well, it is desirable to provide an appropriate level adjustment mechanism in the preceding stage so that a peak value coincides with the regulator voltage VDDL.

The flip-flop circuit 15 is a D-type (data type) flip-flop circuit and includes a data terminal D, a clock terminal C, an output terminal Q, an inverted output terminal QB, and a reset terminal RB. The power supply voltage VDD is input to the data terminal D, a reset signal RSTB is input to the reset terminal RB, and the input signal CIN is input to the clock terminal C.

When the reset signal RSTB having a low level is input to the reset terminal RB, in the flip-flop circuit 15, the output terminal Q is reset to a state at the low level and the inverted output terminal QB is reset to a state at the high level, and this state of the flip-flop circuit 15 is maintained. In addition, at a rising edge of a signal input to the clock terminal C in the state in which the reset signal RSTB is at the high level, a logic level of the data terminal D is copied to the output terminal Q and an inverted logic level of the data terminal D is copied to the inverted output terminal QB. Since the data terminal D, to which the power supply voltage VDD is supplied, is logically at the high level, so that at the rising edge of the input signal CIN input to the clock terminal C, a high level is output from the output terminal Q and a low level is output from the inverted output terminal QB. In a case where the peak value of the input signal CIN coincides with the regulator voltage VDDL, it is desirable to add a level shifter circuit (not illustrated) for converting a peak value into the power supply voltage VDD to the clock terminal C. Alternatively, the flip-flop circuit 15 may be operated under the regulator voltage VDDL and the level shifter circuit may be added to the output terminal Q and the inverted output terminal QB.

In the NMOS transistor 133, a source terminal is connected to ground, a drain terminal is connected to the gate terminal of the PMOS transistor 132, and a gate terminal is connected to the inverted output terminal QB of the flip-flop circuit 15. In addition, the PMOS transistor 131 is inserted into a power supply line of the operational amplifier 134 and when the inverted output terminal QB of the flip-flop circuit 15 is at the high level, power supply to the operational amplifier 134 is stopped.

Here, when the inverted output terminal QB of the flip-flop circuit 15 is at the high level, the NMOS transistor 133 is conducted and a potential of the gate terminal of the PMOS transistor 132 is decreased to ground level. At this time, since the PMOS transistor 131 blocks the power supply line of the operational amplifier 134, a current does not flow from the node N1 to a ground via the operational amplifier 134 and the NMOS transistor 133. Since the potential of the gate terminal is decreased to the ground level, the PMOS transistor 132 has a maximum current supply capability and the regulator voltage VDDL is increased up to a level close to the power supply voltage VDD.

The reset signal RSTB is input from an external circuit (not illustrated) to the reset terminal RB of the flip-flop circuit 15. The external circuit outputs a low level pulse as the reset signal RSTB at the time of transitioning from a state in which no pulse is input as the input signal CIN to a state in which a pulse can be input. An example of the time of transitioning from a state in which no pulse is input as the input signal CIN to a state in which a pulse can be input is a time of power-on, a time of returning from an output stop mode in which an output of a signal from the output terminals OUT and OUTB is stopped, a time of returning from a standby mode in which a device including the output circuit 1 changes to a low power consumption state, or the like. For example, a power-on reset circuit (not illustrated) which is an external circuit may output the reset signal RSTB with the low level at the time of power-on, that is, for a while after the power supply voltage VDD rises. In addition, for example, a control circuit (not illustrated), which is an external circuit, may output the reset signal RSTB at a low level for a predetermined period when returning from the output stop mode or the standby mode. When the low level pulse as the reset signal RSTB is input to the reset terminal RB of the flip-flop circuit 15, the inverted output terminal QB is reset to the high level, and according to the function described above, the regulator voltage VDDL is maintained at a level close to the power supply voltage VDD.

Thereafter, if a certain standby time elapses and the input signal CIN is input to the output circuit 1, the input signal CIN is input to the clock terminal C of the flip-flop circuit 15 and in a rising edge of the input signal CIN, the inverted output terminal QB of the flip-flop circuit 15 is changed to the low level. As a result, the NMOS transistor 133 transitions to a blocked state and the PMOS transistor 131 transitions to a conductive state. With this configuration, the regulator 13 is moved to the operation state described above.

In this way, a signal output from the inverted output terminal QB of the flip-flop circuit 15 functions as a control signal for controlling an operation of the regulator 13. In other words, the flip-flop circuit 15 functions as a control circuit for supplying a control signal to the regulator 13. In addition, based on the control signal, the NMOS transistor 133 controls the gate voltage of the PMOS transistor 132 and functions as a transistor for short-circuiting the node N1 and the node N2. After the power supply voltage VDD is applied to the node N1, the regulator 13 changes to a state in which the PMOS transistor 132 has the maximum current supply capability and the node N1 and the node N2 are short-circuited, and the PMOS transistor 131 is at a blocked state and the operation of the operational amplifier 134 is stopped while the node N1 and the node N2 are short-circuited. Further, after an input of the input signal CIN to the pre-drivers 10 and 11 is started, the regulator 13 causes the operational amplifier 134 to control the regulator voltage VDDL so that the regulator voltage VDDL is constant.

In the output circuit 1 according to the first embodiment, the node N1, the node N2, the power supply voltage VDD, and the regulator voltage VDDL respectively correspond to "first node", "second node", "first voltage", and "second voltage" according to the invention. In addition, the PMOS transistor 132, the NMOS transistor 133, the input signal CIN, and signals output from the output terminals OUT and OUTB respectively correspond to "first transistor", "second transistor", "first signal", and "second signal" according to the invention.

Figure 2:
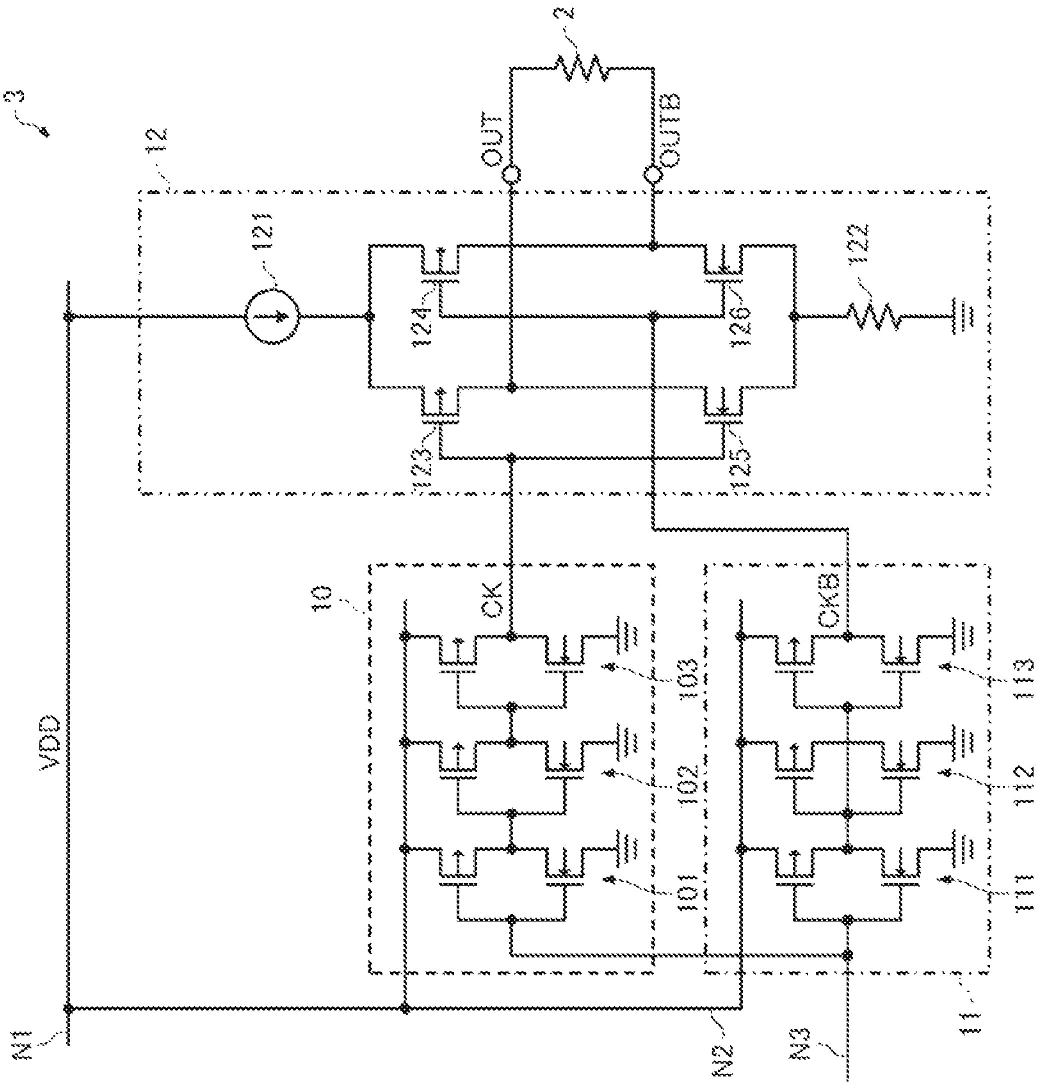
FIG. 2 is a diagram illustrating a configuration of an output circuit according to Comparative Example 1.
Figure 3:
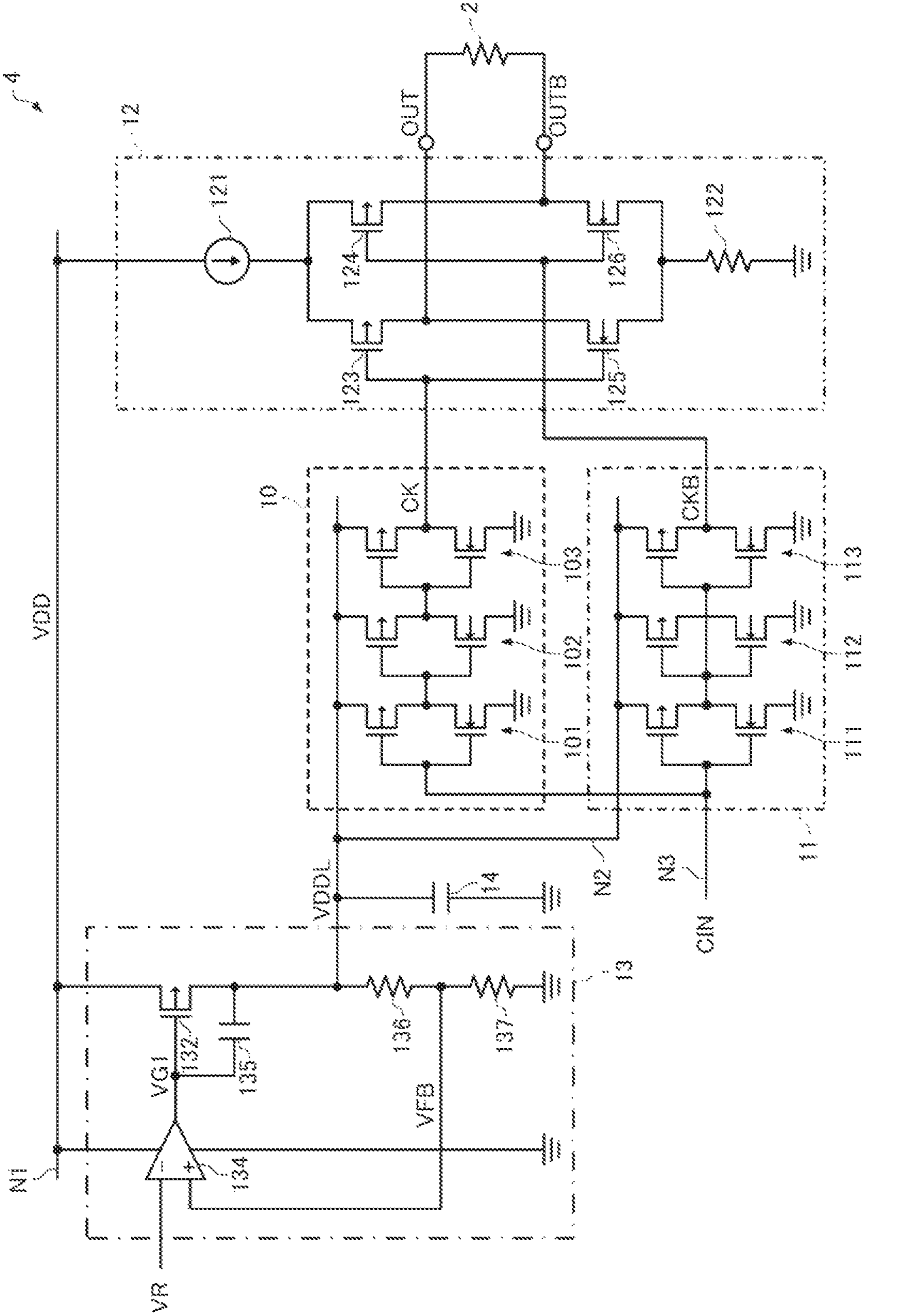
FIG. 3 is a diagram illustrating a configuration of an output circuit according to Comparative Example 2.

Next, the effect will be described by comparing the output circuit 1 according to the first embodiment with an output circuit according to a Comparative Example. FIG. 2 is a diagram illustrating a configuration of an output circuit 3 according to Comparative Example 1 and FIG. 3 is a diagram illustrating a configuration of an output circuit 4 according to Comparative Example 2. In FIGS. 2 and 3, the same components as those in FIG. 1 are denoted by the same reference numerals.

As illustrated in FIG. 2, as compared with the output circuit 1 according to the first embodiment, in the output circuit 3 according to Comparative Example 1, the regulator 13, the bypass capacitor 14, and the flip-flop circuit 15 are omitted and the pre-drivers 10 and 11 operate based on the power supply voltage VDD supplied to the node N1.

In addition, as illustrated in FIG. 3, as compared with the output circuit 1 according to the first embodiment, in the output circuit 4 according to Comparative Example 2, the MOS transistors 131 and 133, and the flip-flop circuit 15 are omitted and a power supply line of the operational amplifier 134 is electrically connected with the node N1.

In the output circuit 3 according to Comparative Example 1 illustrated in FIG. 3, a rising edge and a falling edge of the output signal appearing at the output terminals OUT and OUTB depend on a driving capability of the pre-drivers 10 and 11. As the power supply voltage VDD is higher, the driving capability of the pre-driver increases, and the rising edge and the falling edge of the output signal become steeper. On the other hand, as the power supply voltage VDD is lower, the driving capability of the pre-driver decrease, and the rising edge and the falling edge of the output signal become gradual.

For constructing a system using the output circuit 3, the rising edge and the falling edge of the output signal must be steep to some extent. On the other hand, when the rising edge and the falling edge of the output signal are too steep, a problem occurs, for example, ringing occurs due to a parasitic inductance of wiring or noise is emitted from a signal path. For this reason, both edges must have appropriate slopes. However, since the driving capability of the pre-drivers 10 and 11 depends on the power supply voltage VDD, in a case of a specification in which any power supply voltage VDD can be selected within a predetermined range, an edge in the high power supply voltage VDD is too steep and an edge in the low power supply voltage VDD is too gradual, so it becomes difficult to maintain the edge having a desired slope.

Further, as the peak values of the driving signals CK and CKB output by the pre-drivers 10 and 11 depend on the power supply voltage VDD, a duty ratio of an output pulse also increases and decreases. As a result, a cross-voltage between a waveform of the output signal appearing at the output terminal OUT and a waveform of the output signal appearing at the output terminal OUTB also increases and decreases depending on the power supply voltage VDD. Since it is ideal that these two output signals intersect at a center voltage, this phenomenon should be avoided.

On the contrary, in the output circuit 4 according to Comparative Example 2 illustrated in FIG. 3 or the output circuit 1 according to the first embodiment illustrated in FIG. 1, since the pre-drivers 10 and 11 operate by using the stable regulator voltage VDDL supplied to the node N2 as a power supply voltage, even when the power supply voltage VDD is high or low, the driving capability of the pre-drivers 10 and 11 is kept constant. In addition, the peak values of the driving signals CK and CKB are approximately equal to the regulator voltage VDDL and are constant. Therefore, the waveform of the output signal is approximately the same independent of the power supply voltage VDD. That is, if the regulator voltage VDDL or the like is appropriately adjusted at a design stage, the rising edge and the falling edge of the output signal can be set to the desired slope.

However, since it is necessary to drive the MOS transistors 123, 124, 125, and 126 of the output driver 12, the pre-drivers 10 and 11 have a high driving capability. Therefore, in the output circuit 4 according to Comparative Example 2 illustrated in FIG. 3, when the input signal CIN is input, the pre-drivers 10 and 11 draw a high current from the regulator 13 for each of the edges of the input signal CIN. In a normal operation state, the regulator voltage VDDL is maintained at a desired value given by the equation (1) described above, but for a sudden state change such as transition from a standby state to the normal operation, an operation of the voltage control mechanism via the operational amplifier 134 fails in time, and the regulator voltage VDDL instantaneously and largely decreases. This phenomenon will be specifically described with reference to FIG. 4. In the present embodiment, a standby state of the pre-driver means a state in which the input signal CIN is not input to the pre-drivers 10 and 11. Further, the normal operation state of the pre-driver means a state in which the pre-drivers 10 and 11 operate according to the input signal CIN.

Figure 4:
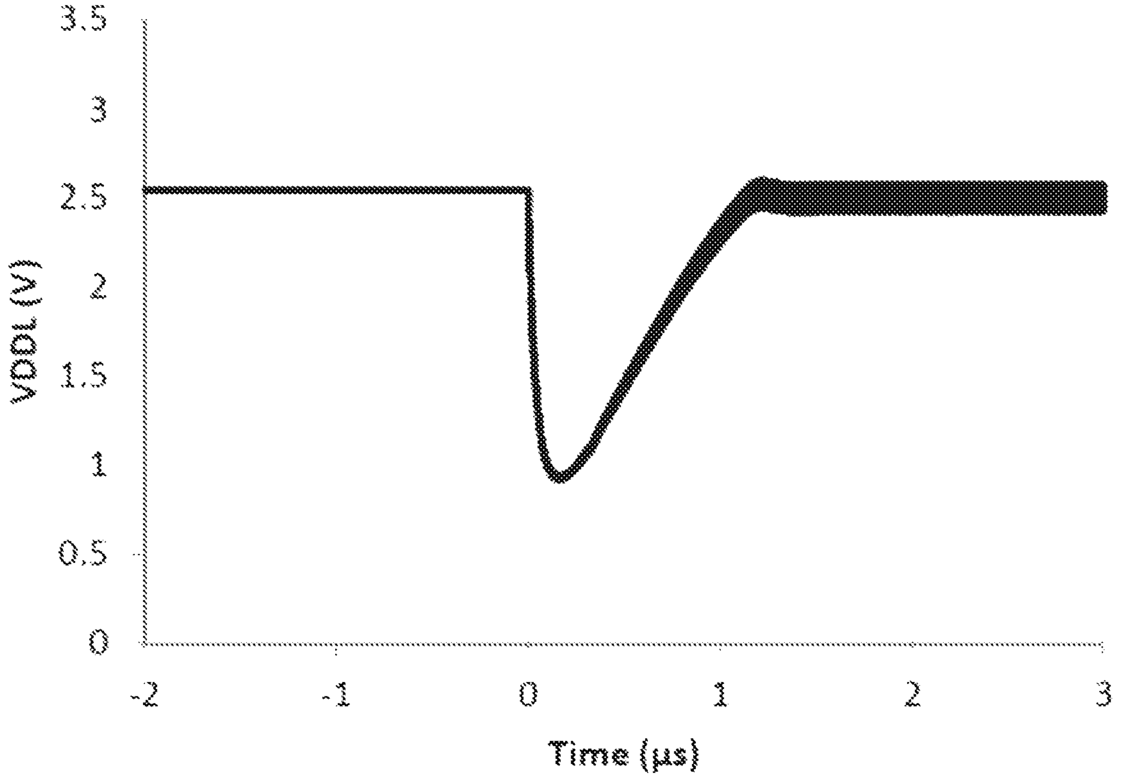
FIG. 4 is a diagram illustrating an example of an operational waveform of the output circuit according to Comparative Example 2.
Figure 4:
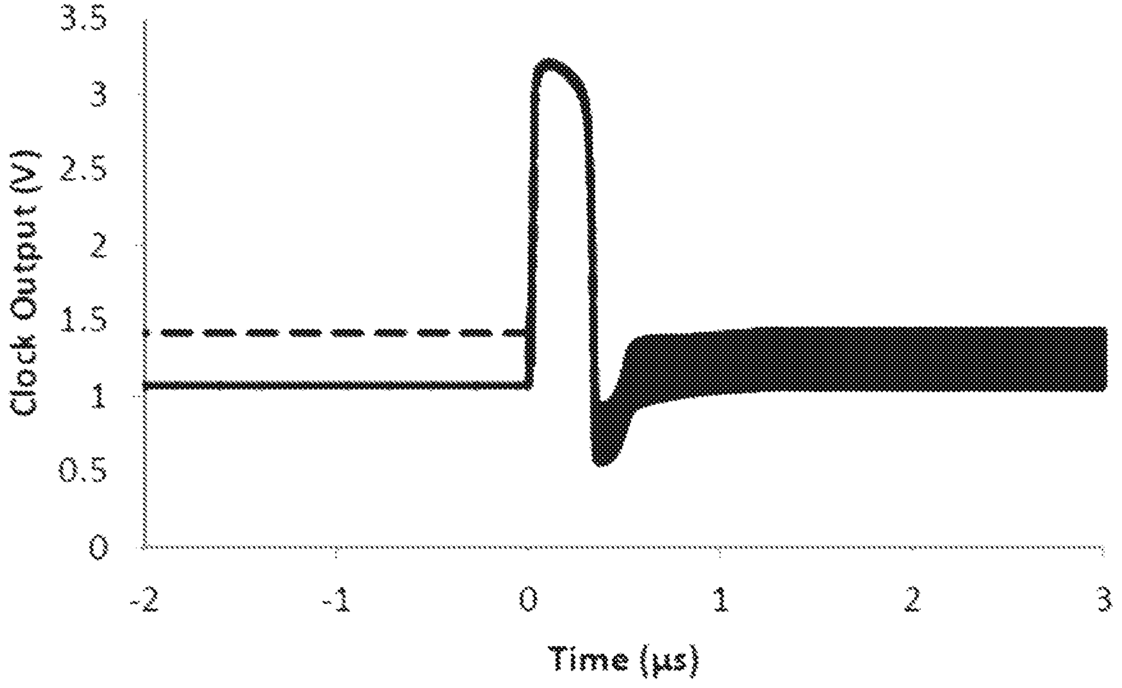

FIG. 4 illustrates an example of an operation waveform in a case where a clock signal as the input signal CIN is input to the output circuit 4 according to Comparative Example 2. The upper part illustrates a waveform of the regulator voltage VDDL and the lower part illustrates a waveform of the output signal output to the output terminals OUT and OUTB. In FIG. 4, the horizontal axis represents a time, and a time when the input signal CIN starts being input to the output circuit 4 is 0. In addition, the power supply voltage VDD is set to 3.3 V and the regulator voltage VDDL is set to approximately 2.5 V.

A period before the time 0 corresponds to, for example, a standby time after power-on. In the standby time, although a potential of each of units of the output circuit 4 is already stabilized, the input signal CIN is not input and a node N3 is kept at 0 V. Therefore, the output terminal OUT (indicated by a solid line) is maintained at a logic state of "low" and the output terminal OUTB (indicated by a broken line) is maintained at a logic state of "high". Specifically, the potential of the output terminal OUT is approximately 1.425 V and the potential of the output terminal OUTB is approximately 1.075 V.

When the standby time is terminated at the time 0, the input signal CIN starts being input to the node N3. Then, the pre-drivers 10 and 11 start operations, but the pre-drivers 10 and 11 need to supply a high current at the rising edge and the falling edge of the input signal CIN. There is no problem if the PMOS transistor 132 of the regulator 13 can immediately increase a supply current, but it is actually impossible and the regulator voltage VDDL is decreased up to approximately 1 V. Since the feedback voltage VFB also decreases as the regulator voltage VDDL decreases, the operational amplifier 134 detects this and decreases the output voltage VG1. With this configuration, the current supply capacity of the PMOS transistor 132 increases and the regulator voltage VDDL turns to increase, but it takes approximately 1 μs until the regulator voltage VDDL returns to 2.5 V.

Amplitudes of the driving signals CK and CKB also decrease while the regulator voltage VDDL decreases. Originally, either one of the PMOS transistors 123 and 124 must be blocked, but if the amplitudes of both of the driving signals CK and CKB are decreased up to approximately 1 V, both move into a conducted state. As a result, as illustrated in the lower part of FIG. 4, both of the output terminals OUT and OUTB increase up to approximately 3.3 V which is a level of the power supply voltage VDD. During this period, since the input signal CIN is not propagated to the output terminals OUT and OUTB, in a system using the output circuit 4 according to Comparative Example 2, there is a high risk of an unexpected defect.

By increasing a capacitance value of the bypass capacitor 14, the degree of reduction of the regulator voltage VDDL is decreased, but in a case of integrating the output circuit 4, the capacity value of the mountable bypass capacitor 14 is limited, so there is a limit to an effect of the bypass capacitor 14. In addition, even if the bypass capacitor 14 can have a large capacity, when activating the output circuit 4, there is a problem that it takes a long time for the regulator voltage VDDL to reach a desired voltage value and the long standby time is required. Therefore, it is difficult to solve the problem that the regulator voltage VDDL decreases by using only the bypass capacitor 14.

In order to solve the problem, as compared with the output circuit 4 according to Comparative Example 2, in the output circuit 1 according to the first embodiment illustrated in FIG. 1, the MOS transistors 131 and 133, and the flip-flop circuit 15 are added. The effect of the output circuit 1 according to the first embodiment by adding the MOS transistors 131 and 133, and the flip-flop circuit 15 will be specifically described with reference to FIG. 5.

Figure 5:
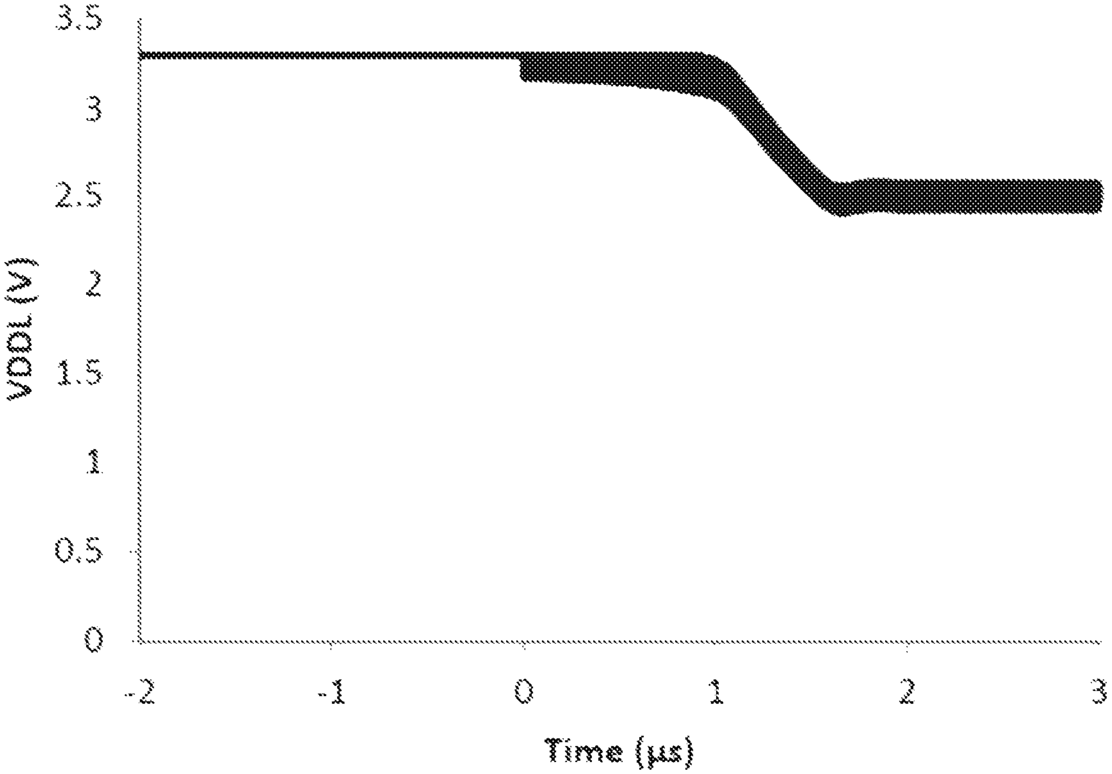
FIG. 5 is a diagram illustrating an example of an operational waveform of the output circuit according to the first embodiment.
Figure 5:
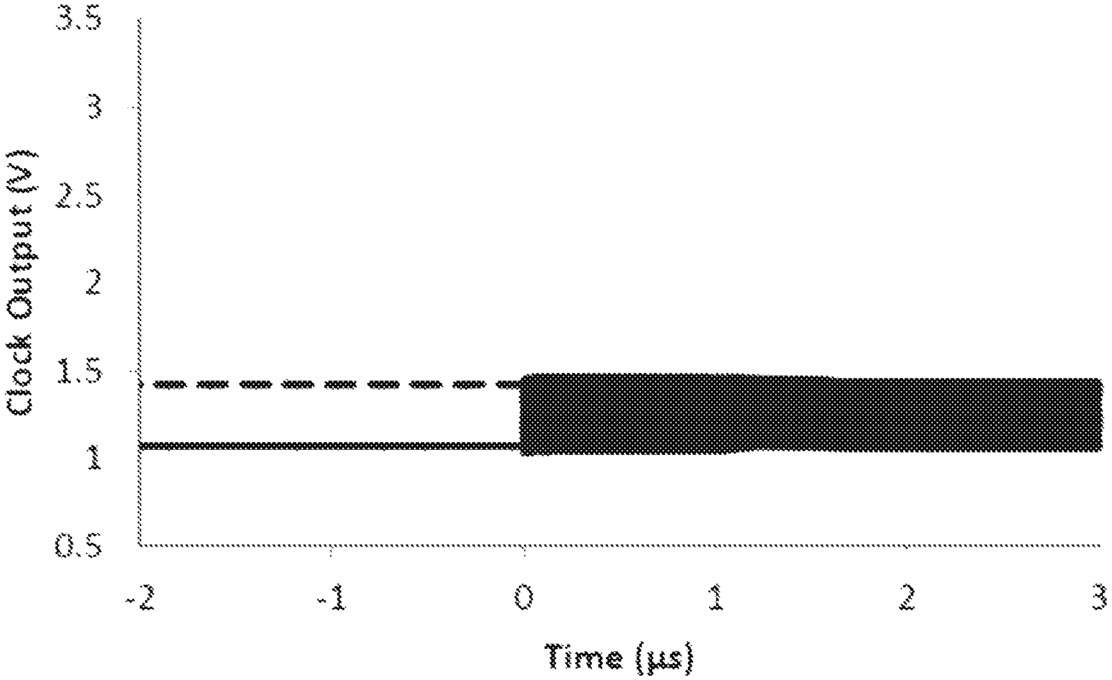

FIG. 5 illustrates an example of an operation waveform in a case where a clock signal as the input signal CIN is input to the output circuit 1 according to the first embodiment. In the same manner as FIG. 4, the upper part illustrates a waveform of the regulator voltage VDDL and the lower part illustrates a waveform of the output signal output to the output terminals OUT and OUTB. In the same manner as FIG. 4, in FIG. 5, the horizontal axis represents a time, and a time when the input signal CIN starts being input to the output circuit 1 is 0. In addition, the power supply voltage VDD is set to 3.3 V and the regulator voltage VDDL is set to approximately 2.5 V.

At a standby time before the time 0, the regulator voltage VDDL is approximately equal to the power supply voltage VDD and is maintained at approximately 3.3 V. When the standby time is terminated at the time 0 and the input signal CIN is input, the pre-drivers 10 and 11 consume a high current, but since the PMOS transistor 132 is already maintained at the maximum current supply capability, no problem occurs. The regulator 13 is moved to the normal operation state in response to the first rising edge of the input signal CIN and as illustrated in the upper part of FIG. 5, the regulator voltage VDDL gradually approaches a predetermined 2.5 V. The decrease in voltage during this period is smooth and a phenomenon in which the voltage is decreased up to approximately 1 V as illustrated in FIG. 4 does not occur. Therefore, the problem that a level of the output signal suddenly increases does not occur, since both of the PMOS transistors 123 and 124 do not move into a conductive state at the same time. As illustrated in the lower part of FIG. 5, even immediately after the standby time is terminated, the output signal swings with a desired amplitude and the logic level of the input signal CIN is appropriately propagated to the output terminals OUT and OUTB.

Figure 6:
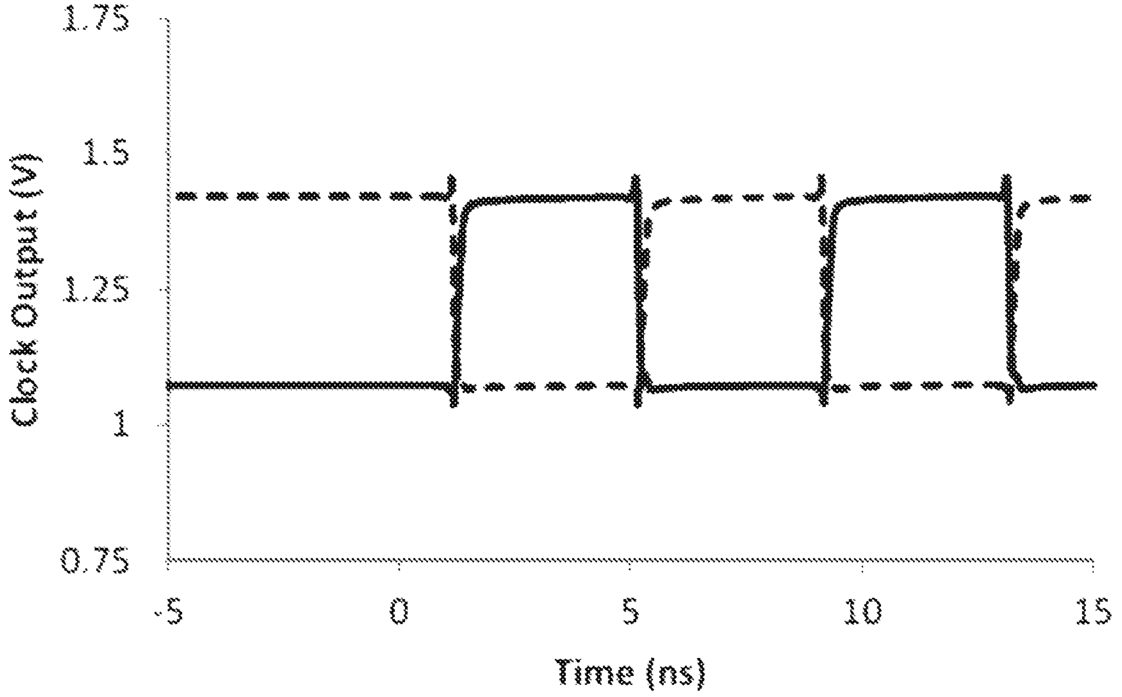
FIG. 6 is an enlarged view illustrating a part of a waveform of an output signal illustrated in the lower part of FIG. 5.
Figure 7:
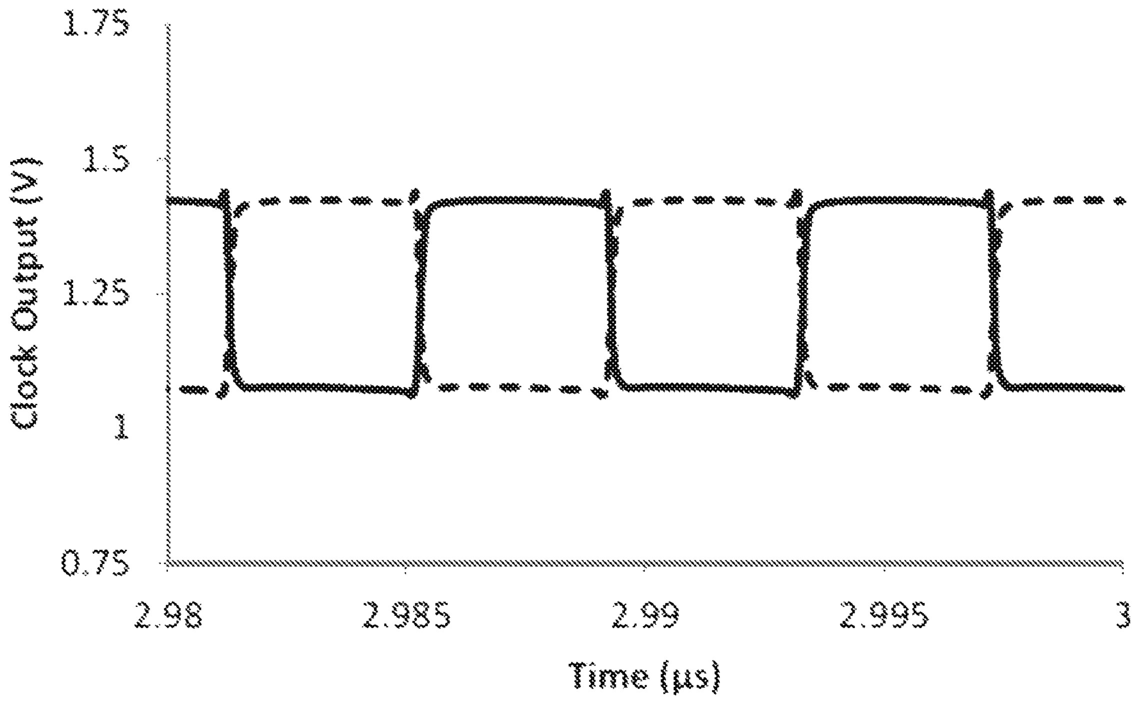
FIG. 7 is an enlarged view illustrating a part of the waveform of the output signal illustrated in the lower part of FIG. 5.

FIGS. 6 and 7 are enlarged views illustrating a part of the waveform of the output signal illustrated in the lower part of FIG. 5. FIG. 6 illustrates a waveform in the vicinity of a time of 0 and FIG. 7 illustrates a waveform in the vicinity of a time of 3 μs. As illustrated in FIG. 7, in the normal operation state, two output signals output to the output terminals OUT and OUTB have desired slopes in which respective rising edges and respective falling edges are not too steep and are not too gradual, and an ideal waveform crossing at a central voltage of 1.25 V is realized. In addition, as illustrated in FIG. 6, at the point when the output signal starts being output, the waveforms of the two output signals are somewhat different from the waveforms in the normal operation state illustrated in FIG. 7 since the peak values of the driving signals CK and CKB are high, but the level of the difference is insignificant and the waveforms in FIG. 6 are still sufficiently practical as a pulse waveform.

As described above, in the output circuit 1 according to the first embodiment, while the pre-drivers 10 and 11 is at the standby state, the regulator 13 short-circuits the node N1 and the node N2 and after the pre-drivers 10 and 11 is moved from the standby state to the normal operation state, the regulator 13 controls a voltage of the node N2 to be the regulator voltage VDDL different from the power supply voltage VDD.

Specifically, a low level pulse as the reset signal RSTB is input to the flip-flop circuit 15 and the NMOS transistor 133 is at a conductive state based on a control signal from the flip-flop circuit 15. The gate voltage of the PMOS transistor 132 is at a ground level, so that the node N1 and the node N2 are short-circuited. With this configuration, the PMOS transistor 132 has the maximum current supply capability. In addition, the PMOS transistor 131 is at a blocked state and the operation of the operational amplifier 134 is stopped while the node N1 and the node N2 are short-circuited. Thereafter, if a certain standby time elapses and an input of the input signal CIN is started, based on the control signal from the flip-flop circuit 15, the NMOS transistor 133 is at a blocked state and the PMOS transistor 131 is at a conductive state, and the operational amplifier 134 operates, so that the regulator voltage VDDL is controlled to be constant.

In this way, according to the output circuit 1 according to the first embodiment, the PMOS transistor 132 has the maximum current supply capability until the input of the input signal CIN is started. Since the input of the input signal CIN is started and a high current can be supplied to the pre-drivers 10 and 11, it is possible to suppress the waveform of the output signal from being disturbed. Further, since the input of the input signal CIN is started and the high current can be supplied to the pre-drivers 10 and 11, it is not necessary to provide a bypass capacitor having a large capacity for stabilizing the regulator voltage VDDL.

1-2. Second Embodiment

Figure 8:
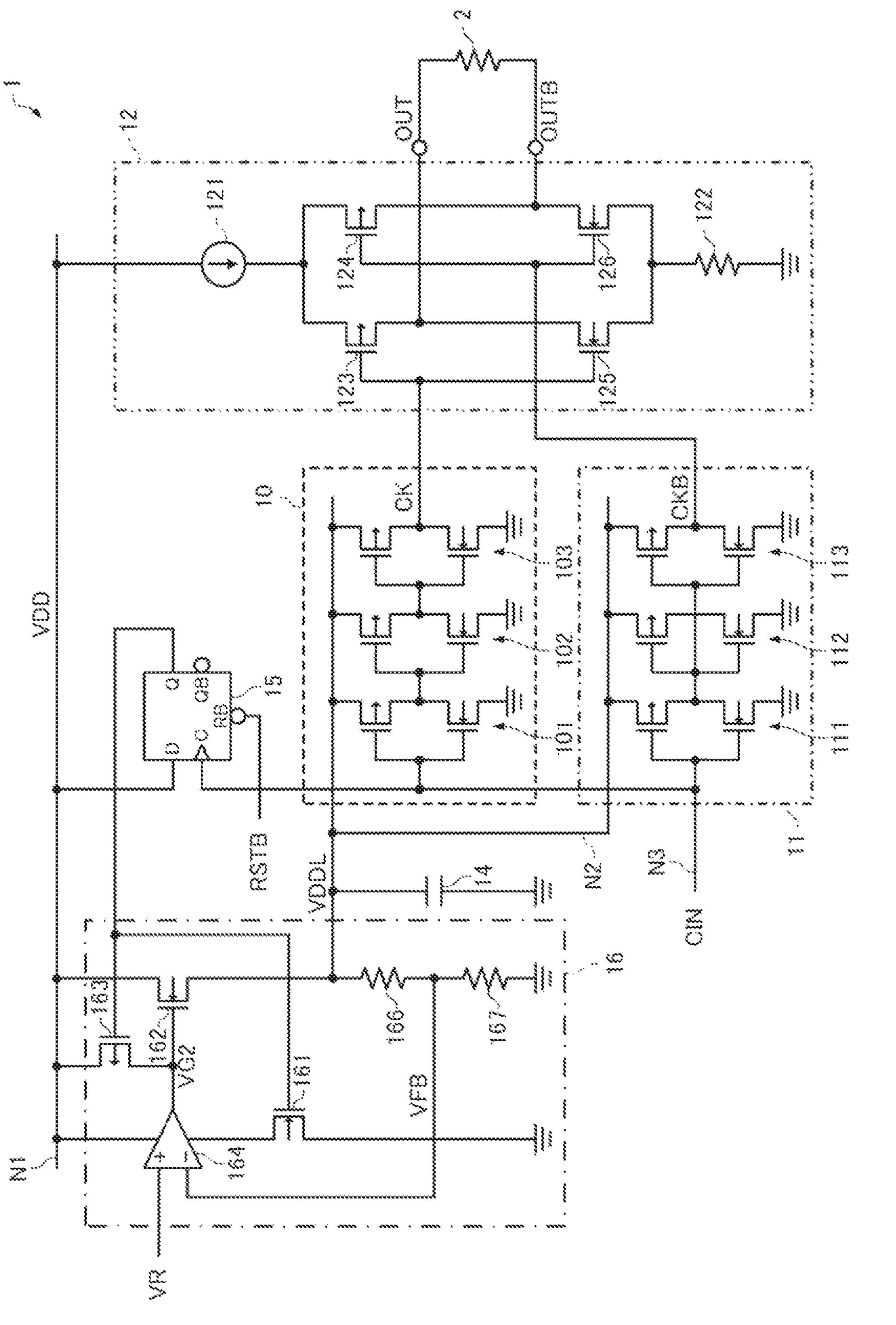
FIG. 8 is a diagram illustrating a configuration of an output circuit according to a second embodiment.

FIG. 8 is a diagram illustrating a configuration of the output circuit 1 according to a second embodiment. In FIG. 8, the same components as those in FIG. 1 are denoted by the same reference numerals. As illustrated in FIG. 8, as compared with the output circuit 1 according to the first embodiment, in the output circuit 1 according to the second embodiment, the regulator 13 is replaced with a regulator 16.

The regulator 16 includes NMOS transistors 161 and 162, a PMOS transistor 163, an operational amplifier 164, and resistors 166 and 167. In the same manner as the regulator 13 illustrated in FIG. 1, the regulator 16 outputs the constant regulator voltage VDDL to the node N2 based on the power supply voltage VDD applied to the node N1. Specifically, the regulator 16 steps down the power supply voltage VDD so as to generate a constant regulator voltage VDDL and outputs the regulator voltage VDDL to the node N2.

The NMOS transistor 162 is electrically connected between the node N1 and the node N2 and supplies a current to the node N2 based on a gate voltage. That is, an output current from the regulator 16 to the node N2 is supplied via the NMOS transistor 162. The feedback voltage VFB obtained by dividing the regulator voltage VDDL by resistors 166 and 167 is input to an inverting input terminal (−) of the operational amplifier 164 and the stable reference voltage VR is input to the other non-inverting input terminal (+). An output voltage VG2 of the operational amplifier 164 increases or decreases depending on magnitude of the feedback voltage VFB. Accordingly, a gate voltage of the NMOS transistor 162 increases or decreases and current supply capability of the NMOS transistor 162 increases or decreases. If the feedback voltage VFB is higher than the reference voltage VR, the output voltage VG2 of the operational amplifier 164 decreases and the current supply capability of the NMOS transistor 162 is decreased. If the feedback voltage VFB is lower than the reference voltage VR, the output voltage VG2 of the operational amplifier 164 increases and the current supply capability of the NMOS transistor 162 is increased. In this way, the operational amplifier 164 functions as an amplifier for performing feedback control on the gate voltage of the NMOS transistor 162 based on the regulator voltage VDDL.

As a result, the circuits are balanced in a state in which the feedback voltage VFB and the reference voltage VR are approximately equal to each other. Therefore, if R1 is a resistance value of the resistor 166 and R2 is a resistance value of the resistor 167, the regulator voltage VDDL output by the regulator 16 is given by the equation (1) described above and becomes a stable voltage independent of the power supply voltage VDD in the same manner as the regulator 13 illustrated in FIG. 1.

Although in the regulator 13 illustrated in FIG. 1, the capacitor 135 is provided, in the regulator 16, by providing the NMOS transistor 162 instead of the PMOS transistor 132, a phase margin of a control loop can be sufficiently large. Accordingly, a capacitor is not provided for phase compensation for stabilizing the voltage control mechanism.

In the PMOS transistor 163, a source terminal is connected to the node N1, a drain terminal is connected to the gate terminal of the NMOS transistor 162, and a gate terminal is connected to the output terminal Q of the flip-flop circuit 15. In addition, the NMOS transistor 161 is inserted into a ground line of the operational amplifier 164 and when the output terminal Q of the flip-flop circuit 15 is at the low level, power supply to the operational amplifier 164 is stopped.

Here, when the output terminal Q of the flip-flop circuit 15 is at the low level, the PMOS transistor 163 is conducted and a potential of the gate terminal of the NMOS transistor 162 is increased to a level of the power supply voltage VDD. At this time, since the NMOS transistor 161 blocks the ground line of the operational amplifier 164, a current does not flow from the node N1 to ground via the PMOS transistor 163 and the operational amplifier 164. Since the potential of the gate terminal is increased to the level of the power supply voltage VDD, the NMOS transistor 162 has a maximum current supply capability and the regulator voltage VDDL is increased up to a level close to the power supply voltage VDD. Actually, since a potential difference between the gate terminal and the source terminal of the NMOS transistor 162 needs to be equal to or larger than a threshold voltage Vth of the NMOS transistor 162, the regulator voltage VDDL becomes lower than the output voltage VG 2 of the operational amplifier 164 by the threshold voltage Vth. Therefore, in order to increase the regulator voltage VDDL up to a level close to the power supply voltage VDD, it is desirable that the NMOS transistor 162 is a depletion type NMOS transistor having the low threshold voltage Vth.

In the same manner as the output circuit 1 according to the first embodiment, also in the output circuit 1 according to the second embodiment, when the low level pulse as the reset signal RSTB is input from an external circuit (not illustrated) to the reset terminal RB of the flip-flop circuit 15, the output terminal Q of the flip-flop circuit 15 is reset to the low level. According to the function described above, the regulator voltage VDDL is maintained at a level close to the power supply voltage VDD.

Thereafter, if a certain standby time elapses and the input signal CIN is input to the output circuit 1 according to the second embodiment, the input signal CIN is input to the clock terminal C of the flip-flop circuit 15 and in a rising edge of the input signal CIN, the output terminal Q of the flip-flop circuit 15 is changed to the high level. As a result, the PMOS transistor 163 transitions to a blocked state and the NMOS transistor 161 transitions to a conductive state. With this configuration, the regulator 16 is moved to the operation state described above.

In this way, a signal output from the output terminal Q of the flip-flop circuit 15 functions as a control signal for controlling an operation of the regulator 16. In other words, the flip-flop circuit 15 functions as a control circuit for supplying a control signal to the regulator 16. In addition, based on the control signal, the PMOS transistor 163 controls the gate voltage of the NMOS transistor 162 and functions as a transistor for short-circuiting the node N1 and the node N2. After the power supply voltage VDD is applied to the node N1, the regulator 16 changes to a state in which the NMOS transistor 162 has the maximum current supply capability and the node N1 and the node N2 are short-circuited, and the NMOS transistor 161 is at a blocked state and the operation of the operational amplifier 164 is stopped while the node N1 and the node N2 are short-circuited. Further, after an input of the input signal CIN to the pre-drivers 10 and 11 is started, the regulator 16 causes the operational amplifier 164 to control the regulator voltage VDDL so that the regulator voltage VDDL is constant.

Since the other configurations of the output circuit 1 according to the second embodiment illustrated in FIG. 8 are the same as the output circuit 1 according to the first embodiment described in FIG. 1, a description of the configurations will be not repeated.

Figure 9:
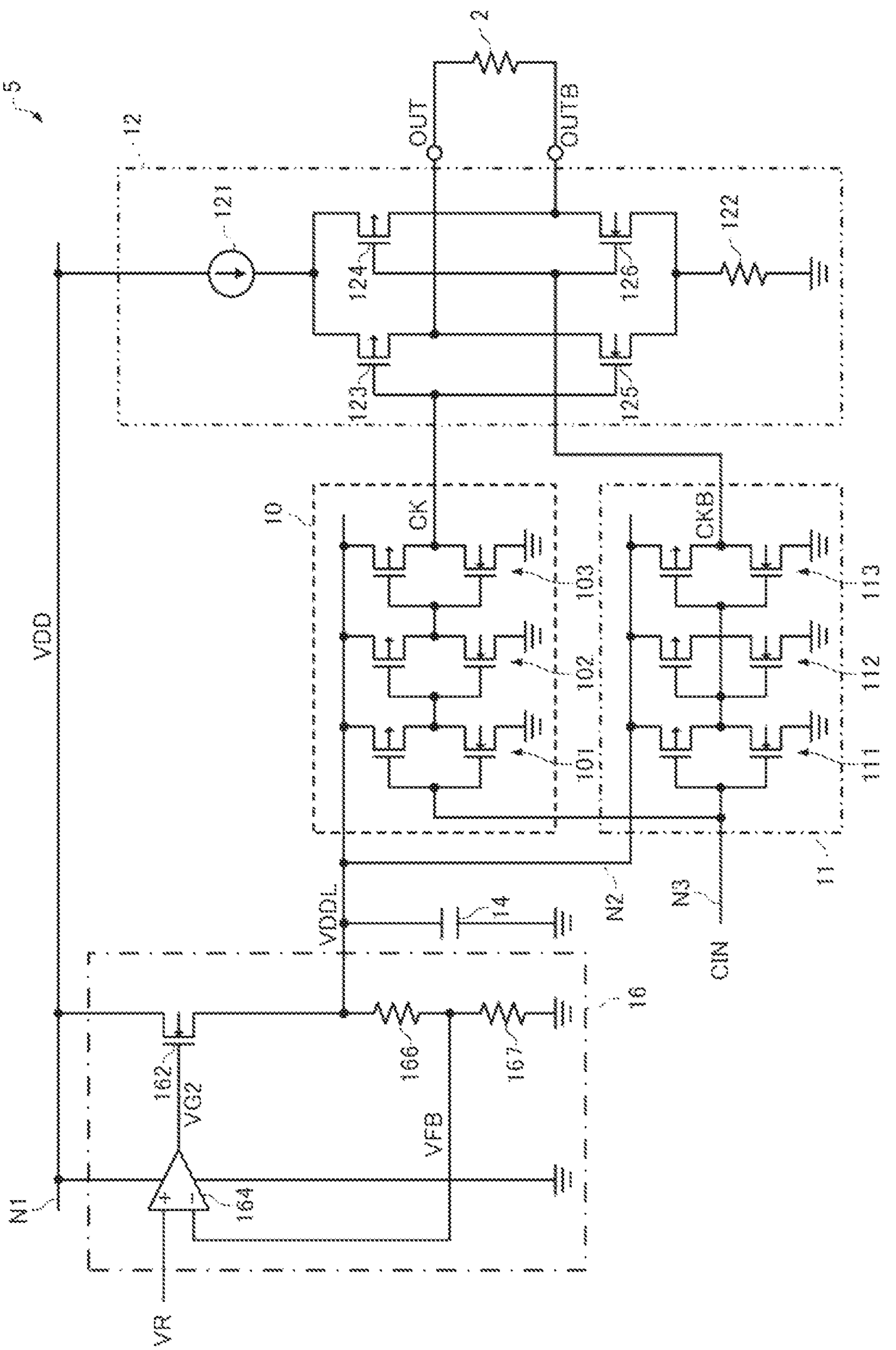
FIG. 9 is a diagram illustrating a configuration of an output circuit according to Comparative Example 3.

Next, the effect will be described by comparing the output circuit 1 according to the second embodiment with an output circuit according to a Comparative Example. FIG. 9 is a diagram illustrating a configuration of an output circuit 5 according to Comparative Example 3. In FIG. 9, the same components as those in FIG. 8 are denoted by the same reference numerals.

As illustrated in FIG. 9, as compared with the output circuit 1 according to the second embodiment, in the output circuit 5 according to Comparative Example 3, the MOS transistors 161 and 163, and the flip-flop circuit 15 are omitted and a ground line of the operational amplifier 164 is electrically connected with ground.

In the output circuit 1 according to the second embodiment illustrated in FIG. 8 or the output circuit 5 according to Comparative Example 3 illustrated in FIG. 9, since the pre-drivers 10 and 11 operate by using the stable regulator voltage VDDL supplied to the node N2 as a power supply voltage, even when the power supply voltage VDD is high or low, the driving capability of the pre-drivers 10 and 11 is kept constant. In addition, the peak values of the driving signals CK and CKB are approximately equal to the regulator voltage VDDL and are constant. Therefore, the waveform of the output signal is approximately the same independent of the power supply voltage VDD. That is, if the regulator voltage VDDL or the like is appropriately adjusted at a design stage, the rising edge and the falling edge of the output signal can be set to the desired slope.

However, since it is necessary to drive the MOS transistors 123, 124, 125, and 126 of the output driver 12, the pre-drivers 10 and 11 have a high driving capability. Therefore, in the output circuit 5 according to Comparative Example 3 illustrated in FIG. 9, when the input signal CIN is input, the pre-drivers 10 and 11 draw a high current from the regulator 16 for each of the edges of the input signal CIN. In a normal operation state, the regulator voltage VDDL is maintained at a desired value given by the equation (1) described above, but for a sudden state change such as transition from a standby state, in which the input signal CIN is not input, to the normal operation, an operation of the voltage control mechanism via the operational amplifier 164 fails in time, and the regulator voltage VDDL instantaneously and largely decreases.

In order to solve the problem, as compared with the output circuit 5 according to Comparative Example 3, in the output circuit 1 according to the second embodiment illustrated in FIG. 8, the MOS transistors 161 and 163, and the flip-flop circuit 15 are added. In the output circuit 1 according to the second embodiment, at the standby time, the regulator voltage VDDL is approximately equal to the power supply voltage VDD. When the standby time is terminated and the input signal CIN is input, the pre-drivers 10 and 11 consume a high current, but since the NMOS transistor 162 is already maintained at the maximum current supply capability, no problem occurs. The regulator 16 is moved to the normal operation state in response to the first rising edge of the input signal CIN and the regulator voltage VDDL gradually approaches a predetermined value. The decrease in voltage during this period is smooth and a phenomenon in which the voltage is largely decreased does not occur. Therefore, the problem that a level of the output signal suddenly increases does not occur, since both of the PMOS transistors 123 and 124 do not move into a conductive state at the same time. For this reason, even immediately after the standby time is terminated, the output signal swings with a desired amplitude, so that the logic level of the input signal CIN is appropriately propagated to the output terminals OUT and OUTB. In the normal operation state, two output signals output to the output terminals OUT and OUTB have desired slopes in which respective rising edges and respective falling edges are not too steep and are not too gradual, and an ideal waveform crossing at a central voltage is realized.

In the output circuit 1 according to the second embodiment, the node N1, the node N2, the power supply voltage VDD, and the regulator voltage VDDL respectively correspond to “first node”, “second node”, “first voltage”, and “second voltage” according to the invention. In addition, the NMOS transistor 162, the PMOS transistor 163, the input signal CIN, and signals output from the output terminals OUT and OUTB respectively correspond to “first transistor”, “second transistor”, “first signal”, and “second signal” according to the invention. Further, in the present embodiment, a standby state of the pre-driver means a state in which the input signal CIN is not input to the pre-drivers 10 and 11. Further, the normal operation state of the pre-driver means a state in which the pre-drivers 10 and 11 operate according to the input signal CIN.

As described above, in the output circuit 1 according to the second embodiment, while the pre-drivers 10 and 11 is at the standby state, the regulator 16 short-circuits the node N1 and the node N2 and after the pre-drivers 10 and 11 is moved from the standby state to the normal operation state, the regulator 16 controls a voltage of the node N2 to be the regulator voltage VDDL different from the power supply voltage VDD.

Specifically, a low level pulse as the reset signal RSTB is input to the flip-flop circuit 15 and the PMOS transistor 163 is at a conductive state based on a control signal from the flip-flop circuit 15. The gate voltage of the NMOS transistor 162 is at the level of the power supply voltage VDD, so that the node N1 and the node N2 are short-circuited. With this configuration, the NMOS transistor 162 has the maximum current supply capability. In addition, the NMOS transistor 161 is at a blocked state and the operation of the operational amplifier 164 is stopped while the node N1 and the node N2 are short-circuited. Thereafter, if a certain standby time elapses and an input of the input signal CIN is started, based on the control signal from the flip-flop circuit 15, the PMOS transistor 163 is at a blocked state and the NMOS transistor 161 is at a conductive state, and the operational amplifier 164 operates, so that the regulator voltage VDDL is controlled to be constant.

In this way, according to the output circuit 1 according to the second embodiment, the NMOS transistor 162 has the maximum current supply capability until the input of the input signal CIN is started. Since the input of the input signal CIN is started and a high current can be supplied to the pre-drivers 10 and 11, it is possible to suppress the waveform of the output signal from being disturbed. Further, since the input of the input signal CIN is started and the high current can be supplied to the pre-drivers 10 and 11, it is not necessary to provide a bypass capacitor having a large capacity for stabilizing the regulator voltage VDDL.

In the output circuit 1 according to the first embodiment, the current supply capability of the PMOS transistor 132 is determined according to a potential difference between the power supply voltage VDD supplied to the source terminal and the output voltage VG1 of the operational amplifier 134 supplied to the gate terminal. For this reason, if a high-frequency noise is superimposed on the power supply voltage VDD, the current supply capability of the PMOS transistor 132 fluctuates, and as a result, the fluctuation amount of the regulator voltage VDDL tends to become large. On the contrary, in the output circuit 1 according to the second embodiment, the current supply capability of the NMOS transistor 162 is determined according to a potential difference between the regulator voltage VDDL supplied to the source terminal and the output voltage VG2 of the operational amplifier 164 supplied to the gate terminal. For this reason, if a high-frequency noise is superimposed on the power supply voltage VDD, the fluctuation amount of the current supply capability of the NMOS transistor 162 decreases, and as a result, the fluctuation amount of the regulator voltage VDDL can be decreased. Further, in order to reduce the fluctuation of the voltage supplied to the gate terminal of the NMOS transistor 162, a high cut filter (for example, a low-pass filter) may be provided between the output terminal of the operational amplifier 164 and the gate terminal of the NMOS transistor 162. As described above, since in the regulator 16, a control loop is so stable that it is not necessary to provide a capacitor for phase compensation, even if a high-cut filter is provided in the control loop, a problem hardly occurs.

1-3. Modification Example

In each of the embodiments described above, the example in which the output circuit 1 outputs the LVDS type signal is described, but the output circuit 1 may output a signal in another format. For example, the output circuit 1 may output a signal in a high speed current steering logic (HCSL) type, a positive emitter coupled logic (PECL) type, or the like.

In addition, in the first embodiment, the PMOS transistor 131 and the operational amplifier 134 are separately provided in the output circuit 1, but instead of the PMOS transistor 131 and the operational amplifier 134, an operational amplifier having a MOS transistor corresponding to the PMOS transistor 131 may be provided. In the same manner, in the second embodiment, the NMOS transistor 161 and the operational amplifier 164 are separately provided in the output circuit 1, but instead of the NMOS transistor 161 and the operational amplifier 164, an operational amplifier having a MOS transistor corresponding to the NMOS transistor 161 may be provided.

In addition, in each of the embodiments described above, based on the input signal CIN, the MOS transistors 133 and 163 are moved from the conductive state to the blocked state, and the MOS transistors 131 and 161 are moved from the blocked state to the conductive state, but a timing when the states of the MOS transistors 131, 133, 161, and 163 are moved is not limited thereto. For example, in a case where the maximum time since the output circuit 1 is activated until a first pulse of the input signal CIN is input is T1, when a predetermined time T2 equal to or longer than T1 elapses since the output circuit 1 is activated, based on the control signal, the MOS transistors 133 and 163 may be moved from the conductive state to the blocked state and the MOS transistors 131 and 161 may be moved from the blocked state to the conductive state. In the output circuit 1 according to Modification Example, a control signal which becomes active after the time T2 elapses from the activation may be input, or may be provided with a circuit which outputs a control signal after the time T2 elapses from the activation. Also in the output circuit 1 according to Modification Example, the input of the input signal CIN to the pre-drivers 10 and 11 is started and the PMOS transistor 132 or the NMOS transistor 162 has the maximum current supply capability, thereafter, the regulator voltage VDDL is controlled to be constant, so that the same effect as each of the embodiments described above is obtained by the regulator 13 or the regulator 16.

2. Oscillator

Figure 10:
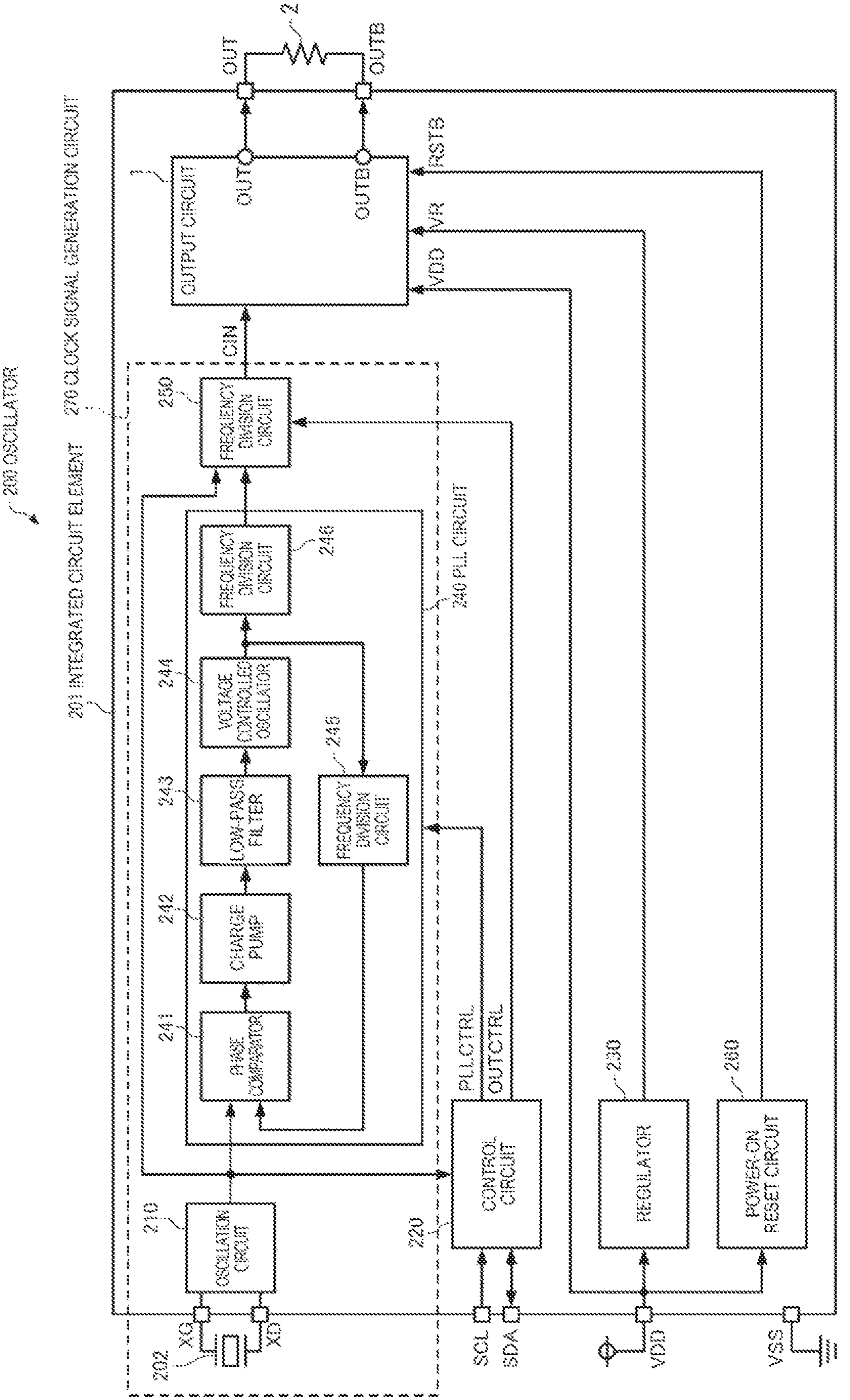
FIG. 10 is a functional block diagram of an oscillator according to the present embodiment.

FIG. 10 is a functional block diagram of an oscillator 200 according to the present embodiment. As illustrated in FIG. 10, the oscillator 200 according to the present embodiment is configured to include an integrated circuit element 201 and a resonator 202.

As the resonator 202, for example, a quartz crystal resonator, a surface acoustic wave (SAW) resonance element, other piezoelectric resonator, a micro electro mechanical systems (MEMS) resonator, or the like is used.

In the present embodiment, the integrated circuit element 201 is configured as a one-chip integrated circuit (IC), and includes an XG terminal, an XD terminal, an SCL terminal, an SDA terminal, a VDD terminal, a VSS terminal, an OUT terminal, and an OUTB terminal. The integrated circuit element 201 includes the output circuit 1 of any one of the embodiments or modification described above. Further, the integrated circuit element 201 includes an oscillation circuit 210, a control circuit 220, a regulator 230, a PLL circuit 240, a frequency division circuit 250, and a power-on reset circuit 260. In the integrated circuit element 201, some of these components may be removed or changed, or other components may be added.

Each of circuits of the integrated circuit element 201 operates with reference to a ground voltage (0 V) supplied via the VSS terminal.

The power-on reset circuit 260 includes, for example, an RC circuit and when the power supply voltage VDD supplied via the VDD terminal exceeds a predetermined voltage, after a predetermined time according to a time constant of the RC circuit elapses, the power-on reset circuit 260 generates a reset signal transitioning from a low Level to a high level. The reset signal is input to the output circuit 1 as the reset signal RSTB described above. The reset signal generated by the power-on reset circuit 260 is also supplied to the control circuit 220 and the PLL circuit 240. When the reset signal transitions to the high level, each of these circuits starts operating.

The regulator 230 generates a predetermined voltage to the ground voltage, based on the power supply voltage VDD. The voltage generated by the regulator 230 becomes a power supply voltage of the oscillation circuit 210 and the PLL circuit 240. In addition, the regulator 230 generates the reference voltage VR described above based on the power supply voltage VDD and outputs the reference voltage VR to the output circuit 1.

The oscillation circuit 210 is connected to one end of the resonator 202 via the XG terminal and is connected to the other end of the resonator 202 via the XD terminal. The oscillation circuit 210 amplifies the output signal of the resonator 202 input via the XG terminal and feeds the amplified signal back to the resonator 202 via the XD terminal to oscillate the resonator 202. For example, an oscillation circuit configured to include the resonator 202 and the oscillation circuit 210 may be various types of oscillation circuits such as a Pierce oscillation circuit, an inverter type oscillation circuit, a Colpitts oscillation circuit, a Hartley oscillation circuit, and the like.

The PLL circuit 240 is phase-synchronized with an oscillation signal output from the oscillation circuit 210, multiplies and divides a frequency of the oscillation signal to generate an oscillation signal, and outputs the oscillation signal. The number of multiplications or a frequency division ratio of the PLL circuit 240 is set according to a control signal PLLCTRL.

In the present embodiment, the PLL circuit 240 is a fractional-N PLL circuit. Specifically, the PLL circuit 240 includes a phase comparator 241, a charge pump 242, a low-pass filter 243, a voltage controlled oscillator 244, a frequency division circuit 245, and a frequency division circuit 246.

The phase comparator 241 compares a phase difference between an oscillation signal output from the oscillation circuit 210 and an oscillation signal output from the frequency division circuit 245, and outputs a comparison result as a pulse voltage.

The charge pump 242 converts the pulse voltage output from the phase comparator 241 into a current, and the low-pass filter 243 smoothes the current output from the charge pump 242 and converts the resultant current into a voltage.

The voltage controlled oscillator 244 outputs the oscillation signal of which a frequency is changed according to the output voltage of the low-pass filter 243. For example, the voltage controlled oscillator 244 is realized by an LC oscillation circuit including an inductor and a variable capacitance element.

The frequency division circuit 245 outputs an oscillation signal obtained by integer-dividing the oscillation signal output from the voltage controlled oscillator 244 with the frequency division ratio (integer frequency division ratio) set by the control signal PLLCTRL. The frequency division ratio of the frequency division circuit 245 changes in time series to a plurality of integer values within a range close to an integer value N, and a time average value of the frequency division ratio is N+F/M. Therefore, in a normal state in which a phase of the oscillation signal output from the oscillation circuit 210 and a phase of the oscillation signal output from the frequency division circuit 245 are synchronized, a frequency $f_{VCO}$ of the oscillation signal output from the voltage controlled oscillator 244 and a frequency $f_{OSC}$ of the oscillation signal output from the oscillation circuit 210 satisfy a relationship of the following Equation (2).

$$f_{VCO} = \left(N + \frac{F}{M}\right) \times f_{OSC} \tag{2}$$

The frequency division circuit 246 outputs an oscillation signal obtained by integer-dividing the oscillation signal output from the voltage controlled oscillator 244 with the frequency division ratio set by the control signal PLLCTRL.

The frequency division circuit 250 outputs a clock signal obtained by dividing the oscillation signal output from the PLL circuit 240 (frequency division circuit 246) according to the frequency division ratio set by a control signal OUTCTRL. The clock signal is input to the output circuit 1 as the input signal CIN described above.

In this way, a clock signal generation circuit 270 for generating a clock signal as the input signal CIN of the output circuit 1 is configured to include the resonator 202, the oscillation circuit 210, the PLL circuit 240, and the frequency division circuit 250.

The output circuit 1 operates by the power supply voltage VDD being supplied to the node N1 (see FIGS. 1, 8, and the like) described above, generates two output signals having polarities inverted from each other based on the input signal CIN, the reference voltage VR, and the reset signal RSTB, and outputs the output signals from the output terminals OUT and OUTB. The output terminals OUT and OUTB of the output circuit 1 are respectively connected to the OUT terminal and the OUTB terminal of the integrated circuit element 201 and, for example, the load resistor 2 described above is connected between the OUT terminal and the OUTB terminal outside the integrated circuit element 201.

The control circuit 220 generates the control signal PLLCTRL or the control signal OUTCTRL described above. Specifically, the control circuit 220 includes an interface circuit corresponding to an inter-integrated circuit ($I_2C$) bus and a storage circuit (for example, a register) (both are not illustrated), and receives a serial data signal input via the SDA terminal in synchronization with a serial clock signal input from an external device (not illustrated) via the SCL terminal and stores various data in the storage circuit according to the received serial data. The control circuit 220 generates each of control signals based on various data stored in the storage circuit. The interface circuit included in the control circuit 220 is not limited to the interface circuit corresponding to the $I_2C$ bus, but may be an interface circuit corresponding to a serial peripheral interface (SPI) bus or the like, for example.

In the oscillator 200 according to the present embodiment described above, a clock signal of a frequency according to a setting based on the oscillation signal output from the resonator 202 is generated and output, so that the oscillator 200 can be used, for example, as a clock signal generation device (a clock generator).

In FIG. 10, the reset signal output from the power-on reset circuit 260 at power-on (at the rising of the power supply voltage VDD) is input to the output circuit 1 as the reset signal RSTB, but the input timing is not limited to the time of power-on. The reset signal RSTB may be supplied at the time of transition from a state in which a clock signal is not output from the clock signal generation circuit 270 to a state in which the clock signal is output. An example of the time of transitioning from the state in which the clock signal is not output from the clock signal generation circuit 270 to the state in which the clock signal is output is a time of returning from an output stop mode in which an output of the clock signal from the OUT terminal and the OUTB terminal of the integrated circuit element 201 is stopped, a time of returning from a standby mode in which the oscillator 200 changes to a low power consumption state, or the like in addition to a time of power-on. For example, an output enable (OE) terminal for setting the output stop mode may be added to the integrated circuit element 201, and when a signal input from the OE terminal is at a low level (invalid), the oscillation circuit 210 and the PLL circuit 240 may be operated. Meanwhile, the output of the clock signal from the frequency division circuit 250 may be stopped. In addition, for example, a standby (ST) terminal for setting the standby mode may be provided in the integrated circuit element 201, and when a signal input from the ST terminal is at a high level (valid), the oscillation circuit 210 and the PLL circuit 240 may be stopped. For example, when the signal input from the OE terminal is changed from the low level to the high level or when the signal input from the ST terminal is changed from the high level to the low level, the control circuit 220 may output a low level pulse as the reset signal RSTB.

According to the oscillator 200 according to the present embodiment described above, by providing the output circuit 1 at the latter stage of the clock signal generation circuit 270, the output of the clock signal is started from the clock signal generation circuit 270 and the high current is supplied to the pre-drivers 10 and 11 of the output circuit 1, so that it is possible to suppress the waveform of the output clock signal from being disturbed.

In addition to the oscillator 200, the oscillator according to the invention may be applied to an oscillator not having a PLL circuit, an oscillator having a temperature compensation function such as a temperature compensated crystal oscillator (TCXO), an oscillator having a frequency control function such as a voltage controlled crystal oscillator (VCXO).

3. Electronic Apparatus

Figure 11:
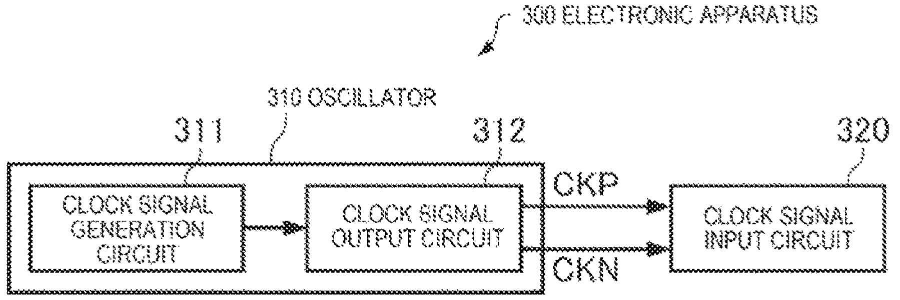
FIG. 11 is a functional block diagram of an electronic apparatus according to the present embodiment.

FIG. 11 is a functional block diagram of a part of a configuration of an electronic apparatus according to the present embodiment. As illustrated in FIG. 11, an electronic apparatus 300 according to the present embodiment includes a clock signal output circuit 312 and a clock signal input circuit 320.

The clock signal output circuit 312 outputs, for example, LVDS type differential clock signals CKP and CKN having polarities inverted from each other. As the clock signal output circuit 312, the output circuit 1 according to each of the embodiments described above can be applied.

The electronic apparatus 300 may include an oscillator 310. The oscillator 310 includes a clock signal generation circuit 311 and the clock signal output circuit 312. The clock signal generation circuit 311 generates a clock signal having a desired frequency. The clock signal output circuit 312 outputs the differential clock signals CKP and CKN based on the clock signal generated by the clock signal generation circuit 311. The differential clock signals CKP and CKN are output outside the oscillator 310. As the oscillator 310, for example, the oscillator 200 according to the embodiment described above can be applied. In this case, the clock signal generation circuit 270 included in the oscillator 200 and the output circuit 1 respectively corresponds to the clock signal generation circuit 311 and the clock signal output circuit 312.

The differential clock signals CKP and CKN which are clock signals output from the clock signal output circuit 312 are input to the clock signal input circuit 320.

Figure 12:
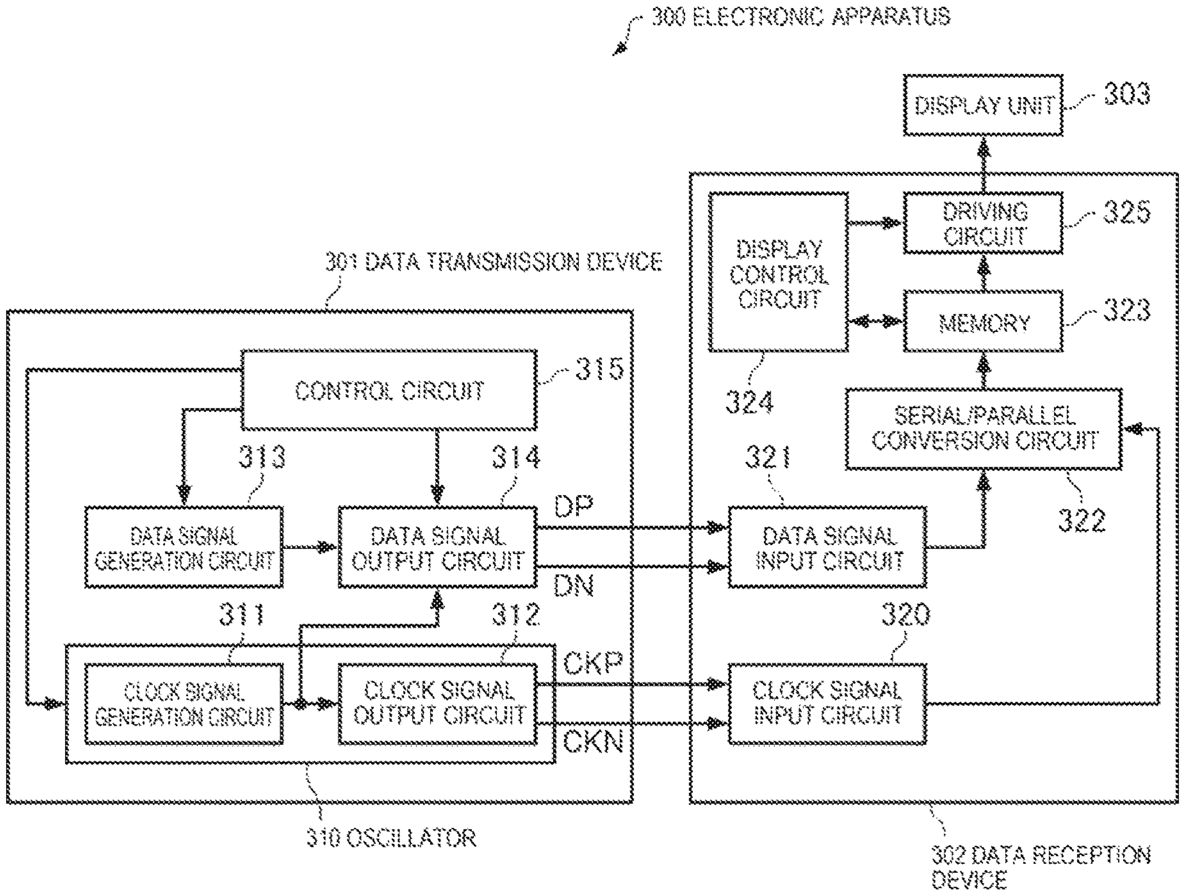
FIG. 12 is a diagram of a specific configuration example of the electronic apparatus according to the present embodiment.

FIG. 12 is a diagram of a specific configuration example of the electronic apparatus 300 according to the present embodiment. In FIG. 12, the same components as those in FIG. 11 are denoted by the same reference numerals. The electronic apparatus 300 illustrated in FIG. 12 is a display apparatus such as a liquid crystal display apparatus and includes a data transmission device 301, a data reception device 302, and a display unit 303.

The data transmission device 301 includes the oscillator 310, a data signal generation circuit 313, a data signal output circuit 314, and a control circuit 315.

The oscillator 310 includes the clock signal generation circuit 311 and the clock signal output circuit 312 and outputs the differential clock signals CKP and CKN.

The data signal generation circuit 313 generates a data signal corresponding to an image displayed on the display unit 303. For example, the data signal generation circuit 313 receives original image data which is a source of an image from an external device of the data transmission device 301 via an interface circuit (not illustrated) and generates a data signal according to the original image data.

The data signal output circuit 314 outputs differential data signals DP and DN having polarities inverted from each other, in synchronization with the clock signal generated by the clock signal generation circuit 311, based on the data signal generated by the data signal generation circuit 313.

The control circuit 315 controls operations of the oscillator 310, the data signal generation circuit 313, and the data signal output circuit 314.

The data reception device 302 includes the clock signal input circuit 320, a data signal input circuit 321, a serial/parallel conversion circuit 322, a memory 323, a display control circuit 324, and a driving circuit 325.

The differential clock signals CKP and CKN are input to the clock signal input circuit 320 and the clock signal input circuit 320 generates a clock signal obtained by differentially amplifying the differential clock signals CKP and CKN.

The differential data signals DP and DN are input to the data signal input circuit 321 and the data signal input circuit 321 generates serial data obtained by differentially amplifying the differential data signals DP and DN.

The serial/parallel conversion circuit 322 converts the serial data generated by the data signal input circuit 321 into parallel data in synchronization with the clock signal generated by the clock signal input circuit 320.

The image data converted into the parallel data by the serial/parallel conversion circuit 322 is stored in the memory 323. The memory 323 is configured to include a RAM or the like and can store the image data converted into the parallel data for at least one frame.

The display control circuit 324 reads the image data for one frame from the memory 323, performs an image process such as gamma correction on the read image data, writes the image data after the image process in the memory 323, and transmits the image data written in the memory 323 to the driving circuit 325, for example.

The driving circuit 325 outputs the data signal to be supplied to each of data lines (not illustrated) of the display unit 303 based on the image data transmitted from the memory 323. In addition, the driving circuit 325 outputs a scanning signal for selecting each of scanning lines (not illustrated) of the display unit 303 in sequence.

The display unit 303 includes a plurality of data lines (not illustrated), a plurality of scanning lines (not illustrated) extending in a direction intersecting the plurality of data lines, and a plurality of pixels (not illustrated) provided at positions at which the plurality of data lines and the plurality of scanning lines intersect with each other. A voltage according to the data signal supplied to each of the driving lines is held in each of the pixel provided at the position at which the scanning line selected by the scanning signal intersects with each of the data lines. Accordingly, an image is displayed on the display unit 303.

Figure 13:
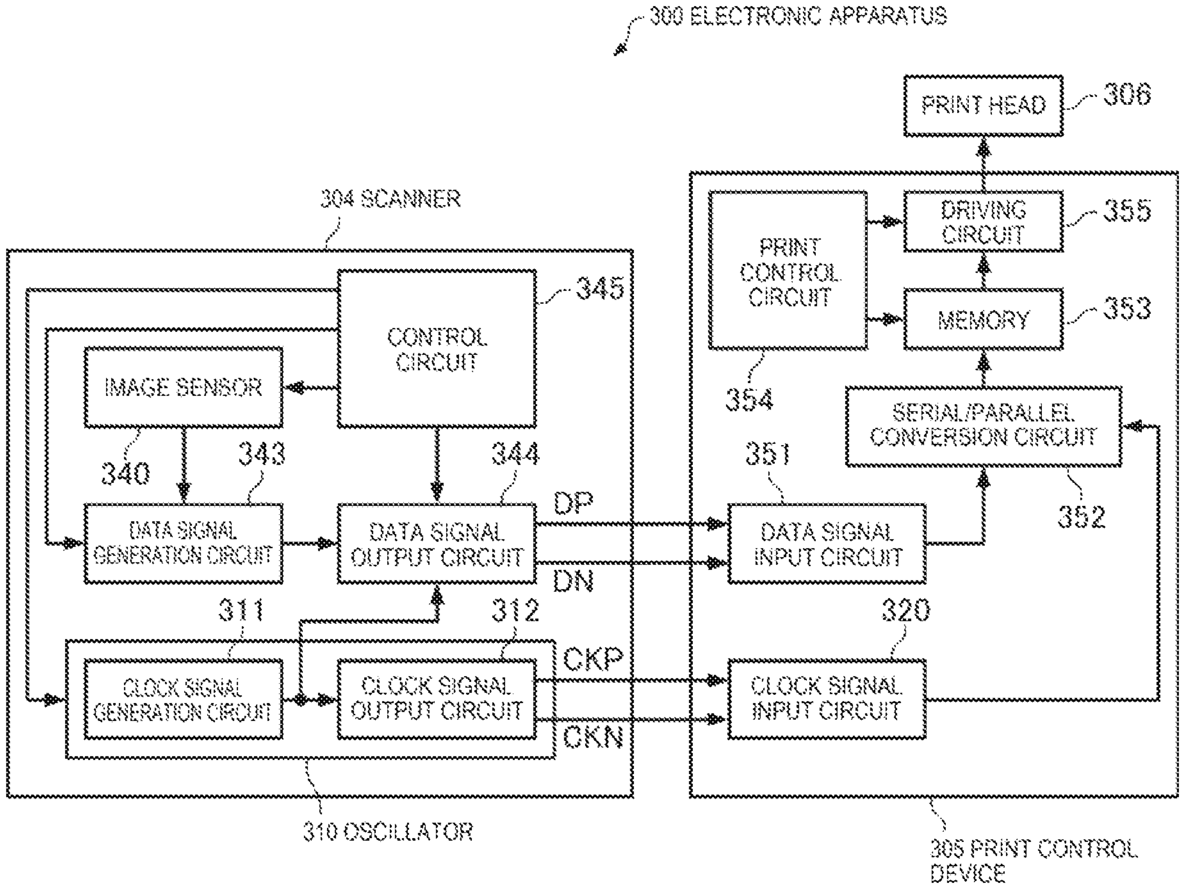
FIG. 13 is a diagram illustrating another specific configuration example of the electronic apparatus according to the present embodiment.

FIG. 13 is a diagram illustrating another specific configuration example of the electronic apparatus 300. In FIG. 13, the same components as those in FIG. 11 are denoted by the same reference numerals. The electronic apparatus 300 illustrated in FIG. 13 is a printing apparatus including a scanner function, and includes a scanner 304, a print control device 305, and a print head 306.

The scanner 304 includes the oscillator 310, an image sensor 340, a data signal generation circuit 343, a data signal output circuit 344, and a control circuit 345.

The oscillator 310 includes the clock signal generation circuit 311 and the clock signal output circuit 312 and outputs the differential clock signals CKP and CKN.

The image sensor 340 receives light reflected from an image formed on a medium such as paper and generates an image signal based on a signal obtained by photoelectric conversion.

The data signal generation circuit 343 performs A/D conversion on the image signal generated by the image sensor 340 to generate a digital data signal.

The data signal output circuit 344 outputs the differential data signals DP and DN having polarities inverted from each other, in synchronization with the clock signal generated by the clock signal generation circuit 311, based on the data signal generated by the data signal generation circuit 343.

The control circuit 345 controls operations of the oscillator 310, the image sensor 340, the data signal generation circuit 343, and the data signal output circuit 344.

The print control device 305 includes the clock signal input circuit 320, a data signal input circuit 351, a serial/parallel conversion circuit 352, a memory 353, a print control circuit 354, and a driving circuit 355.

The differential clock signals CKP and CKN are input to the clock signal input circuit 320 and the clock signal input circuit 320 generates a clock signal obtained by differentially amplifying the differential clock signals CKP and CKN.

The differential data signals DP and DN are input to the data signal input circuit 351 and the data signal input circuit 351 generates serial data obtained by differentially amplifying the differential data signals DP and DN.

The serial/parallel conversion circuit 352 converts the serial data generated by the data signal input circuit 351 into parallel data in synchronization with the clock signal generated by the clock signal input circuit 320.

The image data converted into the parallel data by the serial/parallel conversion circuit 352 is stored in the memory 353. The memory 353 is configured to include a RAM or the like and can store the image data converted into the parallel data for at least one page.

The print control circuit 354 reads the image data for one page from the memory 353, performs various image processes on the read image data, writes the image data after the image process in the memory 353, and transmits the image data written in the memory 353 to the driving circuit 355, for example.

The driving circuit 355 outputs the driving signal to be supplied to each of emitting units (not illustrated) of the print head 306 based on the image data transmitted from the memory 353.

Each of the emitting units of the print head 306 emits the amount of ink according to the supplied driving signal on a medium such as paper or the like or does not emit the ink. Accordingly, an image is formed on the medium.

According to the electronic apparatus 300 according to the present embodiment, by applying the output circuit 1 described above as the clock signal output circuit 312 or by applying the oscillator 200 described above as the oscillator 310, it is possible to suppress the waveforms of the differential clock signals CKP and CKN from being disturbed, so that it is possible to realize high reliability.

Examples of various electronic apparatuses as the electronic apparatus 300 are a personal computer (for example, a mobile personal computer, a laptop personal computer, a tablet personal computer), a mobile terminal such as a smart phone or a mobile phone, a digital camera, an ink jet type ejecting apparatus (for example, an ink jet printer), a storage area network apparatus such as a router or a switch, a local area network apparatus, a mobile terminal base station apparatus, a TV set, a video camera, a video recorder, a car navigation device, a real time clock device, a pager, an electronic notebook (including with a communication function), an electronic dictionary, a calculator, an electronic game machine, a game controller, a word processor, a workstation, a videophone, a security TV monitor, electronic binoculars, a POS terminal, a medical apparatus (for example, an electronic clinical thermometer, a blood pressure monitor, a blood glucose meter, an electrocardiogram measuring device, an ultrasonic diagnostic device, and an electronic endoscope), a fish finder, various measuring instruments, instruments (for example, instruments of a vehicle, an aircraft, and a ship), a flight simulator, a head mounted display, a motion trace, a motion tracking, a motion controller, pedestrian dead-reckoning (PDR), and the like.

In FIGS. 11, 12, and 13, the clock signal generation circuit 311 generates the clock signal to be input to the clock signal output circuit 312, but the clock signal may be supplied from the outside of a device (the data transmission device 301, the scanner 304, or the like) including the clock signal output circuit 312.

The invention is not limited to the above embodiments, and various modifications may be made within the scope of the invention.

The embodiments and modifications described above are merely examples, and the invention is not limited thereto. For example, it is also possible to combine each of the embodiments and each of the modifications as appropriate.

The invention includes substantially the same configuration as the configuration described in the embodiment (for example, a configuration having the same function, method and result or a configuration having the same object and effect). In addition, the invention includes a configuration in which non-essential parts of the configuration described in the embodiment are replaced. Further, the invention includes a configuration which achieves the same operational effect as the configuration described in the embodiment or a configuration which can achieve the same object. In addition, the invention includes a configuration obtained by adding a known technology to the configuration described in the embodiment.

The entire disclosure of Japanese Patent Application No. 2018-034969 filed Feb. 28, 2018 is expressly incorporated herein by reference.

What is claimed is:

1. An output circuit comprising:
- a first node to which a first voltage is applied;
- a second node to which a second voltage is applied;
- a regulator which outputs the second voltage to the second node based on the first voltage applied to the first node;
- a pre-driver to which a first signal is input and which operates based on the second voltage; and
- an output driver to which a signal from the pre-driver is input and which outputs a second signal, wherein the regulator is configured to:
- short-circuit the first node and the second node while the pre-driver is in a standby state; and
- control the second voltage to be different from the first voltage after the pre-driver transitions from the standby state to a normal operation state.

2. The output circuit according to claim 1, further comprising:

a control circuit which supplies a control signal to the regulator, wherein the regulator includes:

a first transistor which is electrically connected between the first node and the second node and supplies a current to the second node based on a gate voltage;

an amplifier which performs feedback control on the gate voltage of the first transistor based on the second voltage; and a second transistor which controls the gate voltage of the first transistor and short-circuits the first node and the second node based on the control signal.

3. The output circuit according to claim 2, wherein an operation of the amplifier is stopped while the first node and the second node are short-circuited.

4. The output circuit according to claim 2, wherein the first transistor is a depletion NMOS transistor.

5. The output circuit according to claim 2, wherein the control circuit is a D-type flip-flop circuit in which a reset signal is input to a reset terminal and the first signal is input to a clock terminal.

6. An oscillator comprising:

an output circuit including:

a first node to which a first voltage is applied;

a second node to which a second voltage is applied;

a regulator which outputs the second voltage to the second node based on the first voltage applied to the first node;

a pre-driver to which a first signal is input and which operates based on the second voltage; and an output driver to which a signal from the pre-driver is input and which outputs a second signal, wherein the regulator is configured to:

short-circuit the first node and the second node while the pre-driver is in a standby state; and control the second voltage to be different from the first voltage after the pre-driver transitions from the standby state to a normal operation state; and a clock signal generation circuit which generates the first signal.

7. The oscillator according to claim 6, further comprising:

a control circuit which supplies a control signal to the regulator, wherein the regulator includes:

a first transistor which is electrically connected between the first node and the second node and supplies a current to the second node based on a gate voltage;

an amplifier which performs feedback control on the gate voltage of the first transistor based on the second voltage; and a second transistor which controls the gate voltage of the first transistor and short-circuits the first node and the second node based on the control signal.

8. The oscillator according to claim 7, wherein an operation of the amplifier is stopped while the first node and the second node are short-circuited.

9. The oscillator according to claim 7, wherein the first transistor is a depletion NMOS transistor.

10. The oscillator according to claim 7, wherein the control circuit is a D-type flip-flop circuit in which a reset signal is input to a reset terminal and the first signal is input to a clock terminal.

11. An electronic apparatus comprising:

an output circuit including:

a first node to which a first voltage is applied;

a second node to which a second voltage is applied;

a regulator which outputs the second voltage to the second node based on the first voltage applied to the first node;

a pre-driver to which a first signal is input and which operates based on the second voltage; and an output driver to which a signal from the pre-driver is input and which outputs a second signal, wherein the regulator is configured to:

short-circuit the first node and the second node while the pre-driver is in a standby state; and control the second voltage to be different from the first voltage after the pre-driver transitions from the standby state to a normal operation state; and a clock signal input circuit to which the second signal output from the output circuit is input.

12. The electronic apparatus according to claim 11, further comprising:

a control circuit which supplies a control signal to the regulator, wherein the regulator includes:

a first transistor which is electrically connected between the first node and the second node and supplies a current to the second node based on a gate voltage;

an amplifier which performs feedback control on the gate voltage of the first transistor based on the second voltage; and a second transistor which controls the gate voltage of the first transistor and short-circuits the first node and the second node based on the control signal.

13. The electronic apparatus according to claim 12, wherein an operation of the amplifier is stopped while the first node and the second node are short-circuited.

14. The electronic apparatus according to claim 12, wherein the first transistor is a depletion NMOS transistor.

15. The electronic apparatus according to claim 12, wherein the control circuit is a D-type flip-flop circuit in which a reset signal is input to a reset terminal and the first signal is input to a clock terminal.

* * * * *